(12) United States Patent
Lai et al.

(10) Patent No.: US 9,748,262 B1
(45) Date of Patent: Aug. 29, 2017

(54) MEMORY STRUCTURE AND MANUFACTURING METHOD OF THE SAME

(71) Applicant: MACRONIX INTERNATIONAL CO., LTD., Hsinchu (TW)

(72) Inventors: Erh-Kun Lai, Taichung (TW); Kuang-Hao Chiang, Taoyuan (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 15/097,335

(22) Filed: Apr. 13, 2016

(51) Int. Cl.
*H01L 27/115* (2017.01)
*H01L 27/11582* (2017.01)
*H01L 27/11556* (2017.01)
*H01L 29/49* (2006.01)

(52) U.S. Cl.
CPC .. *H01L 27/11582* (2013.01); *H01L 27/11556* (2013.01); *H01L 29/495* (2013.01); *H01L 29/4916* (2013.01)

(58) Field of Classification Search
CPC ......... H01L 27/11578; H01L 27/11582; H01L 27/11551; H01L 27/11556
See application file for complete search history.

(56) References Cited

U.S. PATENT DOCUMENTS

| | | | |
|---|---|---|---|
| 8,013,389 B2* | 9/2011 | Oh | H01L 27/0688 257/202 |
| 9,076,687 B2* | 7/2015 | Lee | H01L 27/11582 |
| 9,455,263 B2* | 9/2016 | Zhang | H01L 27/11529 |
| 2014/0284694 A1* | 9/2014 | Kitazaki | H01L 29/66833 257/324 |
| 2015/0064865 A1 | 3/2015 | Sim et al. | |

(Continued)

FOREIGN PATENT DOCUMENTS

WO   2015038427 A1   3/2015

OTHER PUBLICATIONS

Ishiduki, et al.: "Optimal Device Structure for Pipe-shaped BiCS Flash Memory for Ultra High Density Storage Device with Excellent Performance and Reliability"; 97-4244-5640-6/09/$26.00 © 2009 IEEE; pp. 27.3.1-27.3.4.

(Continued)

*Primary Examiner* — Allison P Bernstein
(74) *Attorney, Agent, or Firm* — McClure, Qualey & Rodack, LLP

(57) ABSTRACT

A memory structure and a manufacturing method thereof are provided. The memory structure includes a bottom oxide layer, a first conductive layer on the bottom oxide layer, a first insulation recess, a plurality of insulating layers on the first conductive layer, a plurality of second conductive layers, a second insulation recess, a channel layer on a sidewall of the second insulation recess, and a memory layer located between the channel layer and the second conductive layers. The first insulation recess has a first width and penetrates through the first conductive layer. The second conductive layers and the insulating layers are interlacedly stacked, and the second conductive layers are electrically isolated from the first conductive layer. The second insulation recess located on the first insulation recess has a second width larger than the first width and penetrates through the insulating layers and the second conductive layers.

18 Claims, 26 Drawing Sheets

(56) References Cited

U.S. PATENT DOCUMENTS

2015/0243512 A1* 8/2015 Kishi .................... H01L 21/308
                                                        438/702
2016/0071873 A1* 3/2016 Tsuji ................. H01L 27/11582
                                                        257/324

OTHER PUBLICATIONS

TIPO Office Action dated Jan. 1, 2017 in Taiwan application (No. 105111408).

* cited by examiner

MEMORY STRUCTURE AND MANUFACTURING METHOD OF THE SAME

BACKGROUND

Technical Field

The present disclosure relates in general to a memory structure and a manufacturing method thereof, and particularly to a 3D memory structure and a manufacturing method thereof.

Description of the Related Art

An NVM device which is able to continually store information even when the supply of electricity is removed from the device containing the NVM cell has been widely adopted by bulk solid state memory applications in the art.

The method for fabricating an NVM device having a vertical channel, such as a vertical channel NAND flash memory device, generally includes steps as follows: a multilayered stack configured by a plurality of insulating layers and a plurality of polysilicon layers alternatively stacked with each other is firstly provided on a semiconductor substrate; at least one through hole or trench is then formed in the multilayered stack, and a memory layer with silicon-oxide-nitride-oxide-silicon (SONOS) structure and a polysilicon channel layer are formed in sequence on the sidewalls of the through hole/trench, whereby a plurality of memory cells are defined at the intersection points formed by the SONOS memory layer, the channel layer and the polysilicon layers; and the memory cells are electrically connected to the semiconductor substrate that can serve as a bottom common source line for performing a block erase operation of the NVM device through the channel layer.

However, as the applications of memory devices increase, the demand for the memory devices focuses on small sizes and large memory capacities. For satisfying the requirements, a memory device having a high element density and a small size and a simplified manufacturing method thereof are in need.

Therefore, there is a need of providing a memory device and the method for fabricating the same to obviate the drawbacks encountered from the prior art.

SUMMARY

The present disclosure relates in general to a memory structure and a manufacturing method thereof. In the memory structure of the embodiments, two recesses are formed respectively by two etching processes, such that the total depth of the recesses can be controlled more easily; moreover, the width of the second insulation recess is larger than the width of the first insulation recess, such that the etching process of the second insulation recess can be easily aligned to where the first insulation recess is located.

According to an embodiment of the disclosure, a memory structure is provided. The memory structure includes a bottom oxide layer, a first conductive layer, a first insulation recess, a plurality of insulating layers, a plurality of second conductive layers, a second insulation recess, a channel layer, and a memory layer. The first conductive layer is located on the bottom oxide layer. The first insulation recess penetrates through the first conductive layer and is located on the bottom oxide layer, the first insulation recess having a first width. The insulating layers are located on the first conductive layer. The second conductive layers and the insulating layers are interlacedly stacked, and the second conductive layers are electrically isolated from the first conductive layer. The second insulation recess penetrates through the insulating layers and the second conductive layers and located on the first insulation recess, the second insulation recess having a second width larger than the first width. The channel layer is located on at least a sidewall of the second insulation recess. The memory layer is located between the channel layer and the second conductive layers.

According to another embodiment of the disclosure, a manufacturing method of a memory structure is provided. The manufacturing method of the memory structure includes the following steps: forming a bottom oxide layer; forming a first conductive layer on the bottom oxide layer; forming a first insulation recess penetrating through the first conductive layer and located on the bottom oxide layer, the first insulation recess having a first width; forming a plurality of insulating layers on the first conductive layer; forming a plurality of second conductive layers, wherein the second conductive layers and the insulating layers are interlacedly stacked, and the second conductive layers are electrically isolated from the first conductive layer; forming a second insulation recess penetrating through the insulating layers and the second conductive layers and located on the first insulation recess, the second insulation recess having a second width larger than the first width; forming a channel layer on at least a sidewall of the second insulation recess; and forming a memory layer between the channel layer and the second conductive layers.

The above and other aspects of the disclosure will become better understood with regard to the following detailed description of the non-limiting embodiment(s). The following description is made with reference to the accompanying drawings.

BRIEF DESCRIPTION OF THE DRAWINGS

FIGS. 11A-11K-1 illustrate a process for manufacturing a memory structure according to a still further embodiment of the present disclosure; and FIGS. 12A-12B-1 illustrate a process for manufacturing a memory structure according to a further additional embodiment of the present disclosure.

DETAILED DESCRIPTION

Figure 1:
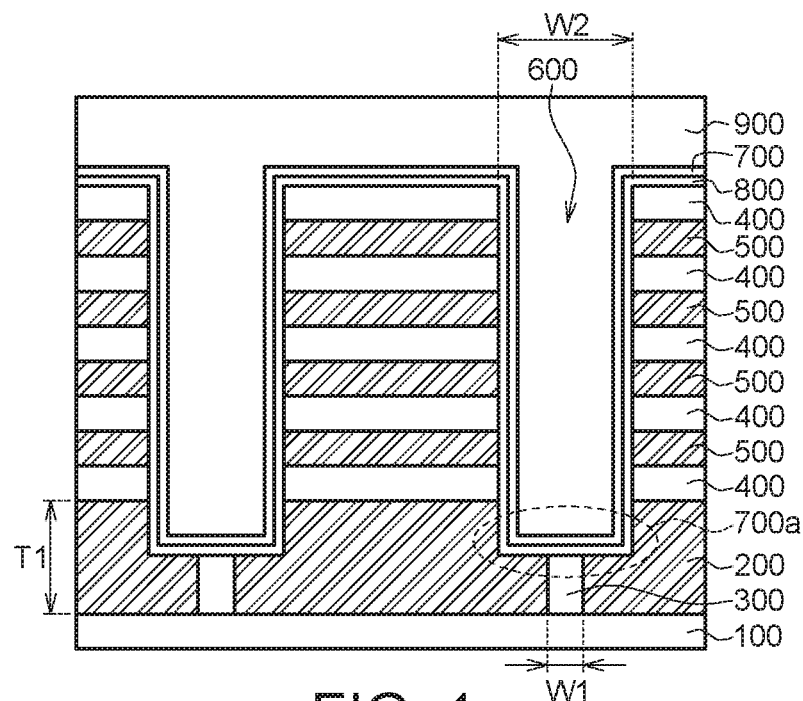
FIG. 1 shows a schematic drawing of a memory structure according to an embodiment of the present disclosure.

In the embodiments of the present disclosure, a memory structure and a method of manufacturing the same are provided. In the memory structure of the embodiments, two recesses are formed respectively by two etching processes, such that the total depth of the recesses can be controlled more easily; moreover, the width of the second insulation recess is larger than the width of the first insulation recess, such that the etching process of the second insulation recess can be easily aligned to where the first insulation recess is located. The following embodiments are for the purpose of elaboration only, not for limiting the scope of protection of the invention. Besides, some of the secondary elements are omitted in the drawings accompanying the following embodiments to highlight the technical features of the invention.

It is to be noted that the following descriptions of preferred embodiments of this invention are presented herein for purpose of illustration and description only. It is not intended to be exhaustive or to be limited to the precise form disclosed. Also, it is also important to point out that there may be other features, elements, steps and parameters for implementing the embodiments of the present disclosure which are not specifically illustrated. Thus, the specification and the drawings are to be regard as an illustrative sense rather than a restrictive sense. Various modifications and similar arrangements may be provided by the persons skilled in the art within the spirit and scope of the present invention. In addition, the illustrations may not be necessarily drawn to scale, and the identical elements of the embodiments are designated with the same reference numerals.

Referring FIG. 1, a schematic drawing of a memory structure according to an embodiment of the present disclosure is shown. As shown in FIG. 1, the memory structure 10 includes a bottom oxide layer 100, a first conductive layer 200, a first insulation recess 300, a plurality of insulating layers 400, a plurality of second conductive layers 500, a second insulation recess 600, a channel layer 700, and a memory layer 800.

As shown in FIG. 1, the first conductive layer 200 is located on the bottom oxide layer 100. The first insulation recess 300 penetrates through the first conductive layer 200 and is located on the bottom oxide layer 100, and the first insulation recess 300 has a first width W1. The insulating layers 400 are located on the first conductive layer 200. The second conductive layers 500 and the insulating layers 400 are interlacedly stacked, and the second conductive layers 500 are electrically isolated from the first conductive layer 200. The second insulation recess 600 penetrates through the insulating layers 400 and the second conductive layers 500 and is located on the first insulation recess 300, and the second insulation recess 600 has a second width W2 larger than the first width W1. The channel layer 700 is located on at least a sidewall of the second insulation recess 600. The memory layer 800 is located between the channel layer 700 and the second conductive layers 500.

According to the embodiments of the present disclosure, the memory structure 10 may be the main structure of a 3D vertical channel NAND flash memory device, wherein the first conductive layer 200 is such as an inversion gate, and the second conductive layers 500 are such as word lines.

According to the embodiments of the present disclosure, the two recesses 300 and 600 are formed respectively by two etching processes, such that the total depth of the recesses can be controlled more easily; moreover, the second width W2 of the second insulation recess 600 is larger than the first width W1 of the first insulation recess 300, such that the etching process of the second insulation recess 600 can be easily aligned to where the first insulation recess 300 is located.

Further speaking, as shown in FIG. 1, according to the embodiments of the present disclosure, the channel layer 700 is located on the sidewalls and the bottom surface of the second insulation recess 600 forming a U-shaped area 700a within the first conductive layer 200, such that even the U-shaped area 700a of the channel layer 700 can be located close to the first conductive layer 200, and thus a relatively large range of the channel layer 700 can be controlled by the gate (through the first conductive layer 200). Accordingly, the range of the channel layer which is uncontrolled by the gate can be effectively reduced, as such, the undesired influence caused by larger resistance and smaller current of the region of the channel layer uncontrolled by the gate can be further minimized.

In addition, as shown in FIG. 1, according to the embodiments of the present disclosure, the channel layer 700 is located on the memory layer 800; in other words, the channel layer 700 is not embedded within the memory layer 800, capped by other films, or embedded in some pipe-lines, as such, it is easier to perform various treatments on the channel layer 700; for example, a heat treatment can be easily performed on the channel layer 700 to increase grain sizes, reduce grain boundaries, and increase currents.

As shown in FIG. 1, in the embodiment, the memory structure 10 may further include a top oxide layer 900. The top oxide layer 900 is located on the insulating layers 400 and the second conductive layers 500.

In the embodiment as shown in FIG. 1, the first insulation recess 300 and the second insulation recess 600 are filled with oxide, and the top oxide layer 900 covers the tops of the channel layer 700 and the second insulation recess 600.

In the embodiment, as shown in FIG. 1, the first conductive layer 200 has a thickness T1 of such as 1500-4000 Å. Specifically speaking, according to the embodiments of the present disclosure, because the first conductive layer 200 has a relatively large thickness T1, forming the two recesses respectively by two etching processes can make the connection of the two recesses 300 and 600 locate within the first conductive layer 200, such that the total depth of the recesses can be controlled more easily, and it is advantageous to the patterning of the second conductive layers 500 (word lines) in the manufacturing process.

In the embodiment, as shown in FIG. 1, the first width W1 of the first insulation recess 300 is such as 10-30 nm, and the second width W2 of the second insulation recess 600 is such as 50-150 nm.

In the embodiment, the first conductive layer 200 and the second conductive layers 500 may respectively include polysilicon, tungsten, or the combination thereof.

Figure 2:
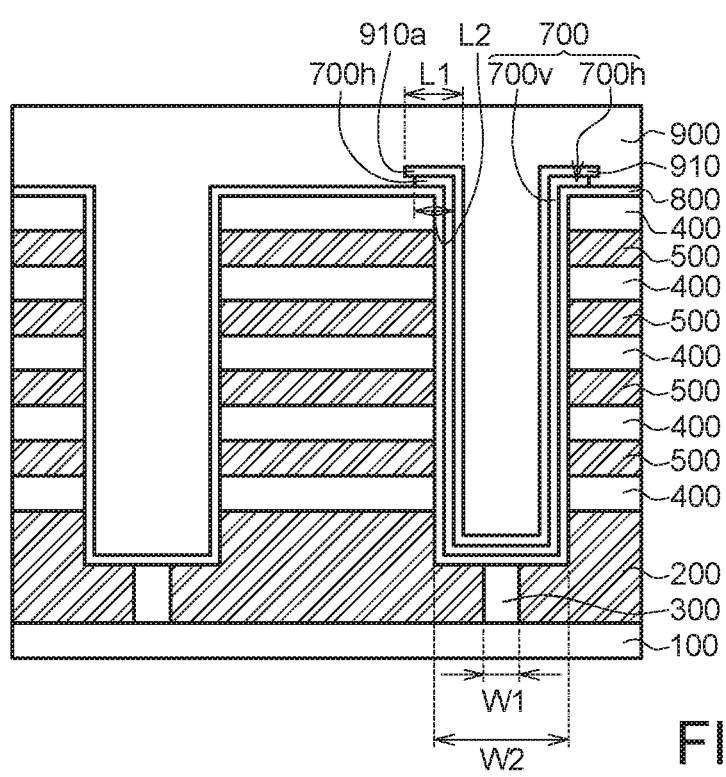
FIG. 2 shows a schematic drawing of a memory structure according to another embodiment of the present disclosure.

Please refer to FIG. 2, which shows a schematic drawing of a memory structure according to another embodiment of the present disclosure. The elements in the present embodiment sharing similar or the same labels with those in the previous embodiment are similar or the same elements, and the description of which is omitted.

As shown in FIG. 2, in the memory structure 20, the channel layer 700 has a vertical extending portion 700v and a horizontal extending portion 700h connected to each other, and the horizontal extending portion 700h is located above the second conductive layers 500.

As shown in FIG. 2, in the embodiment, the memory structure 20 may further include a hard mask layer 910 located on the channel layer 700. The hard mask layer 910 has an extending portion 910a located on the horizontal extending portion 700h of the channel layer 700, and the extending portion 910a of the hard mask layer 910 has an extending length L1 longer than an extending length L2 of the horizontal extending portion 700h of the channel layer 700. In the embodiments, the horizontal extending portion 700h of the channel layer 700 is used for electrically connecting to bit lines of the memory device.

Figure 3:
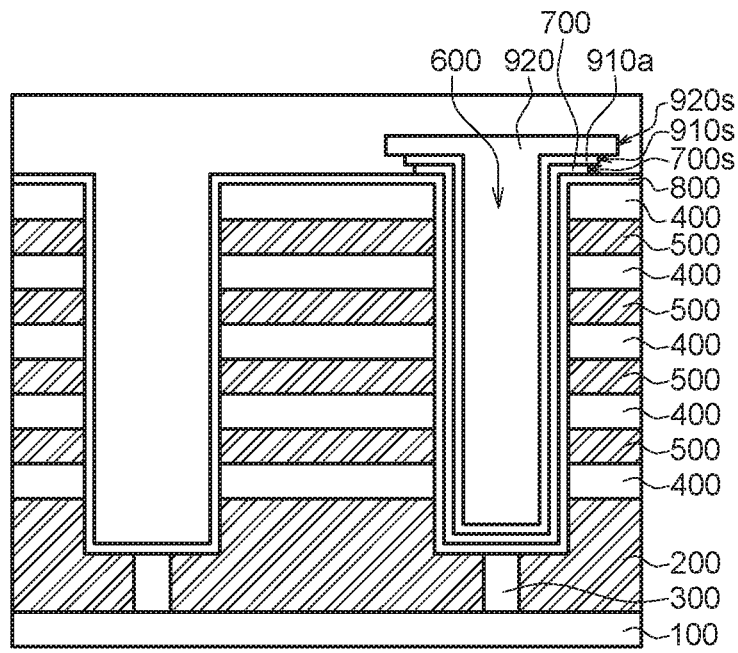
FIG. 3 shows a schematic drawing of a memory structure according to a further embodiment of the present disclosure.

Please refer to FIG. 3, which shows a schematic drawing of a memory structure according to a further embodiment of the present disclosure. The elements in the present embodiment sharing similar or the same labels with those in the previous embodiments are similar or the same elements, and the description of which is omitted.

As shown in FIG. 3, in the embodiment, the memory structure 30 may further include a low-temperature oxide layer 920. The low-temperature oxide layer 920 is located on the hard mask layer 910 and fully covers the extending portion 910a of the hard mask layer 910.

As shown in FIG. 3, in the embodiment, an upper portion of the low-temperature oxide layer 920 has an protruding edge, which has a side surface 920s located beyond the side surface 910s of the extending portion 910a, and the side surface 910s of the extending portion 910a is located beyond the side surface 700s of the horizontal extending portion 700h.

Figure 4:
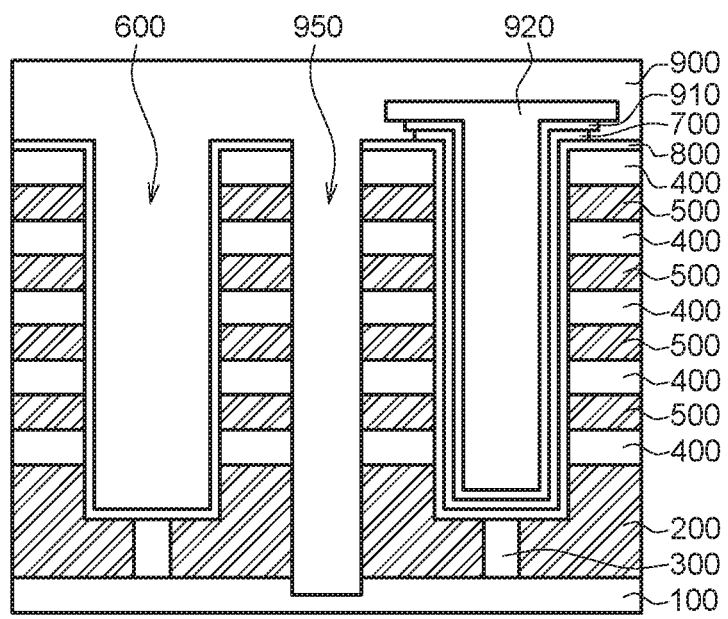
FIG. 4 shows a schematic drawing of a memory structure according to an additional embodiment of the present disclosure.

Please refer to FIG. 4, which shows a schematic drawing of a memory structure according to an additional embodiment of the present disclosure. The elements in the present embodiment sharing similar or the same labels with those in the previous embodiments are similar or the same elements, and the description of which is omitted.

As shown in FIG. 4, in the embodiment, the memory structure 40 may further include a through opening 950. The through opening 950 penetrates through the insulating layers 400, the second conductive layers 500, and the first conductive layer 200, and the through opening 950 is located on the bottom oxide layer 100.

Figure 5:
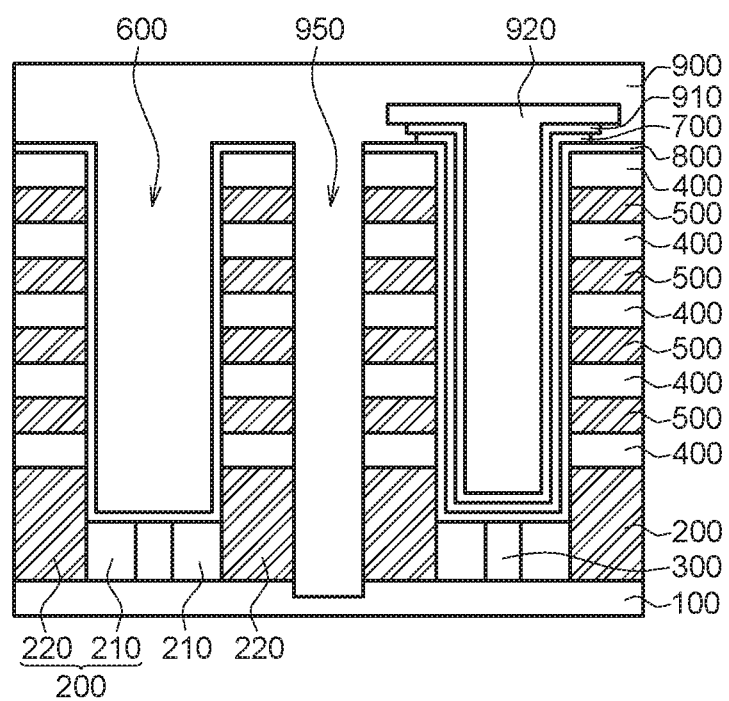
FIG. 5 shows a schematic drawing of a memory structure according to a still further embodiment of the present disclosure.

Please refer to FIG. 5, which shows a schematic drawing of a memory structure according to a still further embodiment of the present disclosure. The elements in the present embodiment sharing similar or the same labels with those in the previous embodiments are similar or the same elements, and the description of which is omitted.

As shown in FIG. 5, in the embodiment, the first conductive layer 200 of the memory structure 50 may include two conductive portions 210 and 220, and the conductive portion 210 and the conductive portion 220 are such as made of different materials. For example, the conductive portion 210 which is located adjacent to the first insulation recess 300 is made of polysilicon, and the conductive portion 220 which is located adjacent to the through opening 950 is made of tungsten.

As shown in FIG. 5, the conductive portion 210 is basically located between the second insulation recess 600 and the bottom oxide layer 100, and the conductive portion 220 is basically located between the insulating layers 400 and the bottom oxide layer 100.

Figure 6:
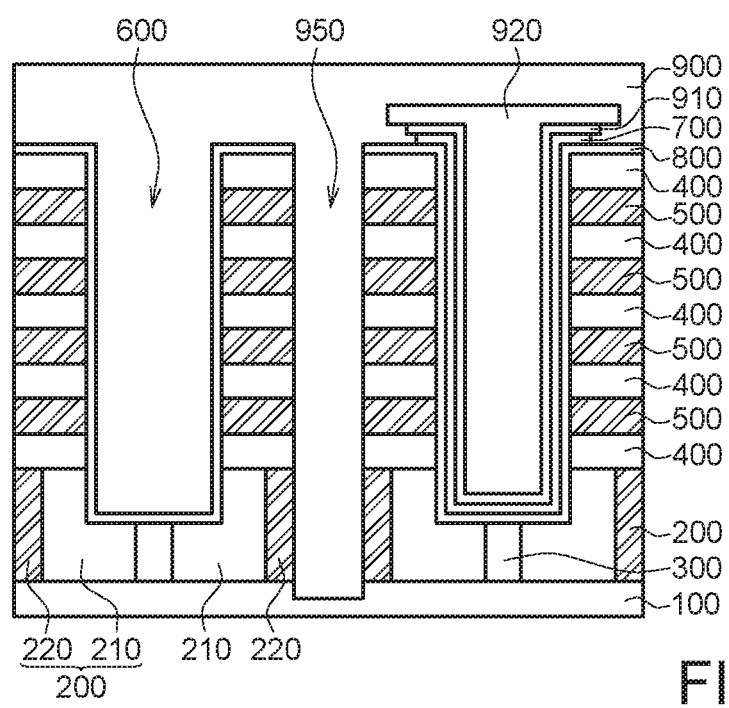
FIG. 6 shows a schematic drawing of a memory structure according to a further additional embodiment of the present disclosure.

Please refer to FIG. 6, which shows a schematic drawing of a memory structure according to a further additional embodiment of the present disclosure. The elements in the present embodiment sharing similar or the same labels with those in the previous embodiments are similar or the same elements, and the description of which is omitted.

As shown in FIG. 6, in the embodiment, the first conductive layer 200 of the memory structure 60 may include two conductive portions 210 and 220. The conductive portion 210 which is located adjacent to the first insulation recess 300 is made of polysilicon, and the conductive portion 220 which is located adjacent to the through opening 950 is made of tungsten.

As shown in FIG. 6, the conductive portion 210 made of polysilicon occupies a larger volume than that occupied by the conductive portion 220 made of tungsten.

FIGS. 7A-7F illustrate a process for manufacturing a memory structure according to an embodiment of the present disclosure. The elements in the present embodiment sharing similar or the same labels with those in the previous embodiments are similar or the same elements, and the description of which is omitted.

Figure 7A:
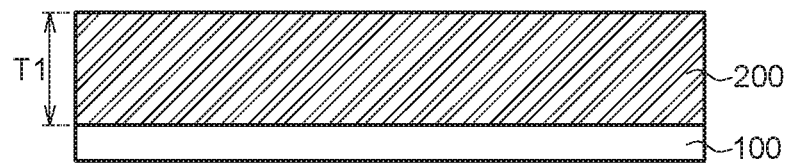
FIGS. 7A-7F illustrate a process for manufacturing a memory structure according to an embodiment of the present disclosure.

As shown in FIG. 7A, the bottom oxide layer 100 is formed, and the first conductive layer 200 is formed on the bottom oxide layer 100. In the embodiment, the first conductive layer 200 is such as a polysilicon layer having a thickness T1 of such as 1500-4000 Å. The first conductive layer 200 can be used as a gate in the memory device.

Figure 7B:
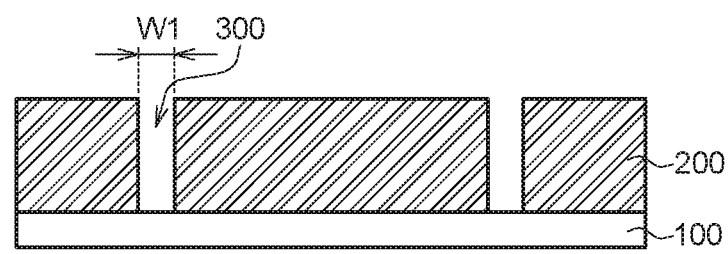

As shown in FIG. 7B, the first insulation recess 300 is formed. The first insulation recess 300 penetrates through the first conductive layer 200 and is located on the bottom oxide layer 100. The first insulation recess 300 has a first width W2 of such as 10-30 nm. In the embodiment, for example, an etching process is performed on the first conductive layer 200 and stops on the bottom oxide layer 100 for forming the first insulation recess 300. This etching process has a high selectivity of the bottom oxide layer 100 to the first conductive layer 200.

Figure 7C:
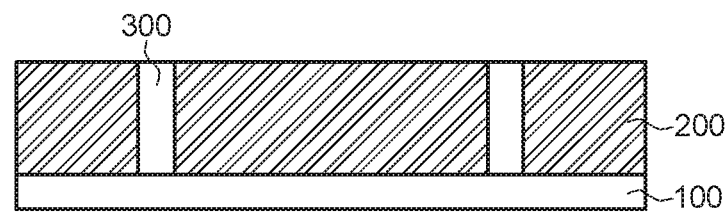

As shown in FIG. 7C, an insulating material is filled in the first insulation recess 300. In the embodiment, for example, an oxide is deposited in the first insulation recess 300, and then the surface of the oxide is planarized by such as a CMP process to a top surface of the first conductive layer 200.

Figure 7D:
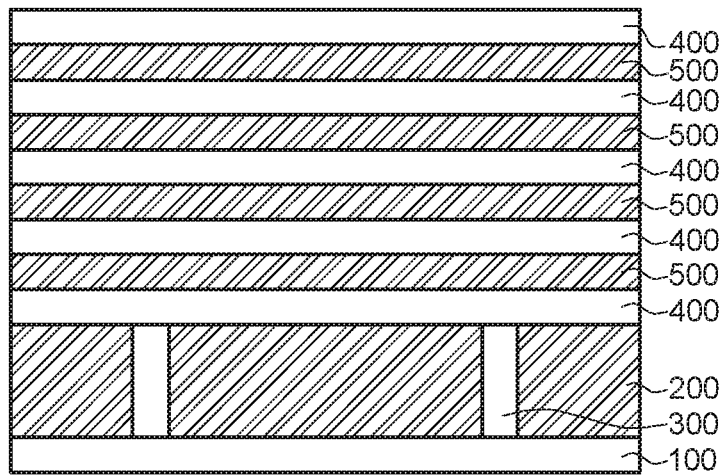

As shown in FIG. 7D, a plurality of insulating layers 400 are formed on the first conductive layer 200, and a plurality of second conductive layers 500 are formed. The second conductive layers 500 and the insulating layers 400 are interlacedly stacked, and the second conductive layers 500 are electrically isolated from the first conductive layer 200. In the embodiment, the insulating layers 400 are such as oxide layers, and the second conductive layers 500 are such as polysilicon layers or doped polysilicon layers, which can be used as word lines in the memory device.

Figure 7E:
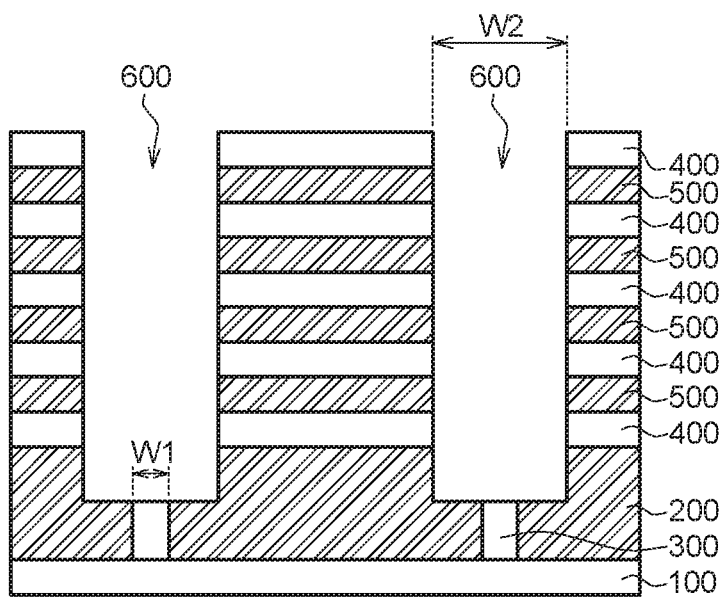

As shown in FIG. 7E, the second insulation recess 600 is formed to penetrate through the insulating layers 400 and the second conductive layers 500 and is located on the first insulation recess 300. The second width W2 of the second insulation recess 600 is larger than the first width W1 of the first insulation recess 300. In the embodiment, the second width W2 of the second insulation recess 600 is such as 50-150 nm.

In the embodiment, for example, the insulating layer 400, the second conductive layers 500, a portion of the first conductive layer 200, and a portion of the insulating material in the first insulation recess 300 are etched, and the etching process stops within the first conductive layer 200 for forming the second insulation recess 600 on the first insulation recess 300. The relatively larger thickness T1 of the first conductive layer 200 is advantageous to the control of the etched depth of the etching process.

According to the embodiments of the present disclosure, two recesses 300 and 600 are formed respectively by two etching processes, and the connection between the two recesses 300/600 is located within the first conductive layer 200, such that the total depth of the recesses can be controlled more easily; moreover, the second width W2 of the second insulation recess 600 is larger than the first width W1 of the first insulation recess 300, such that the etching process of the second insulation recess 600 can be easily aligned to where the first insulation recess 300 is located.

Figure 7F:
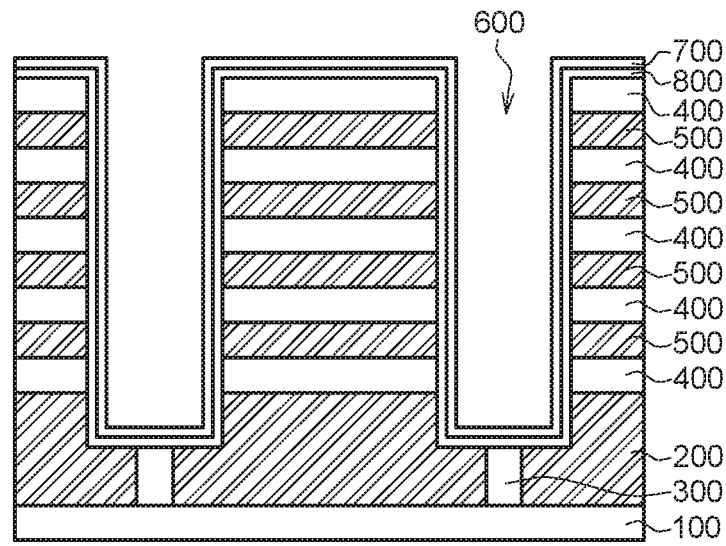

As shown in FIG. 7F, the channel layer 700 is formed on at least a sidewall of the second insulation recess 600, and the memory layer 800 is formed between the channel layer 700 and the second conductive layers 500. In the embodiments, the channel layer 700 is such as a polysilicon layer or a Ge/SiGe/GIZO layer, and the memory layer 800 may have multi-layers of a silicon oxide-silicon nitride-silicon oxide (ONO) structure, a silicon oxide-silicon nitride-silicon oxide-silicon nitride-silicon oxide (ONONO) structure, or a silicon oxide-silicon nitride-silicon oxide-silicon nitride-silicon oxide-silicon nitride-silicon oxide (ONONONO) structure, but not limited thereto.

As shown in FIG. 7F, the channel layer 700 may be further formed on the bottom surface of the second insulation recess 600. Accordingly, the channel layer 700 is mostly located close to the first conductive layer 200 or the second conductive layers 500, as such; the undesired influence to the operation performance of the memory device caused by larger resistance and smaller current of the region of the channel layer uncontrolled by the gate and/or the word lines can be avoided.

Next, please refer to FIG. 1, the top oxide layer 900 is formed on the insulating layers 400 and the second conductive layers 500. As such, the memory structure 10 as shown in FIG. 1 is formed.

Please refer to FIGS. 7A-7F and FIGS. 8A-8H, which illustrate a process for manufacturing a memory structure according to another embodiment of the present disclosure. The elements in the present embodiment sharing similar or the same labels with those in the previous embodiments are similar or the same elements, and the description of which is omitted.

Figure 8A:
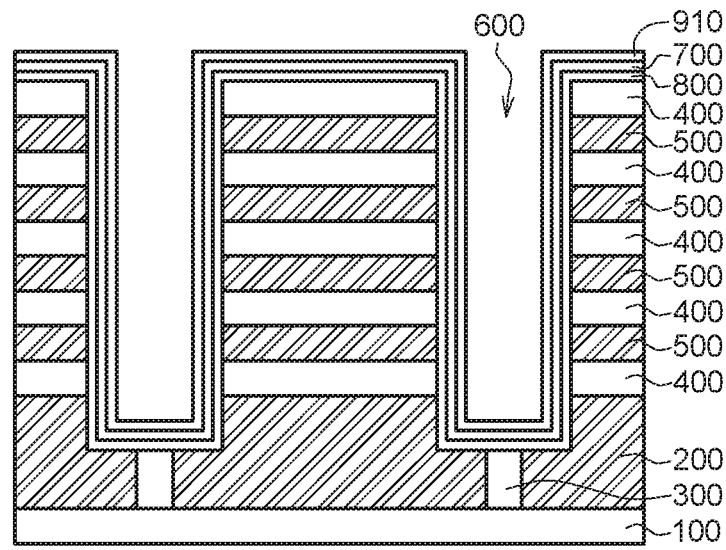
FIGS. 8A-8H illustrate a process for manufacturing a memory structure according to another embodiment of the present disclosure.

After the steps as shown in FIGS. 7A-7F are performed, next, as shown in FIG. 8A, the hard mask layer 910 is formed on the channel layer 700. In the embodiment, the hard mask layer 910 is such as a silicon nitride layer or a silicon oxide layer. The hard mask layer 901 in the present step may be used for protecting the channel layer 700.

Figure 8B:
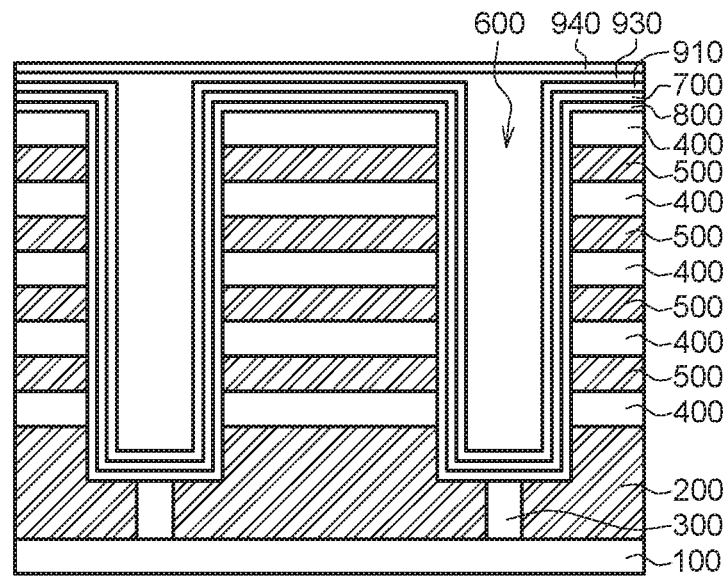

As shown in FIG. 8B, an organic dielectric layer 930 is formed on the hard mask layer 910 and filled in the second insulation recess 600, and another hard mask layer 940 is formed on the organic dielectric layer 930. In the embodiment, as shown in FIG. 8B, the organic dielectric layer 930 has a flat top surface, and the hard mask layer 940 is formed on the flat top surface.

In the embodiment, the organic dielectric layer 930 includes such as an organic dielectric material or Topaz material (Applied Materials), and the hard mask layer 940 includes such as silicon-containing hard-mask bottom anti-reflection coating (SHB), low-temperature oxide (LTO), or DARC (Applied Materials).

Figure 8C:
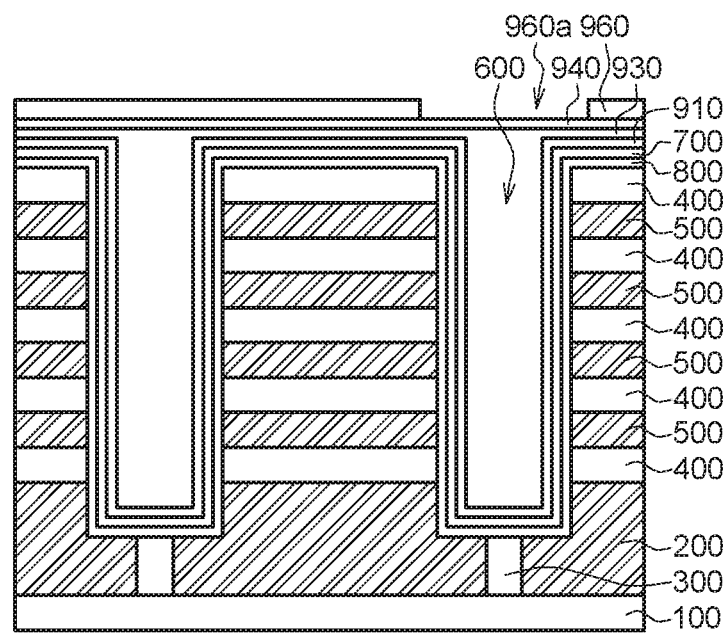

As shown in FIG. 8C, a patterned mask layer 960 is disposed on the hard mask layer 940 for performing the following patterning process. The patterned mask layer 960 has at least an opening 960a, and the opening 960a is corresponding to the predetermined second insulation recess 600. As shown in FIG. 8C, in the embodiment, the structure may has another second insulation recess 600, the opening 960a corresponds to only the predetermined second insulation recess 600, and another second insulation recess 600 is fully covered by the patterned mask layer 960.

Figure 8D:
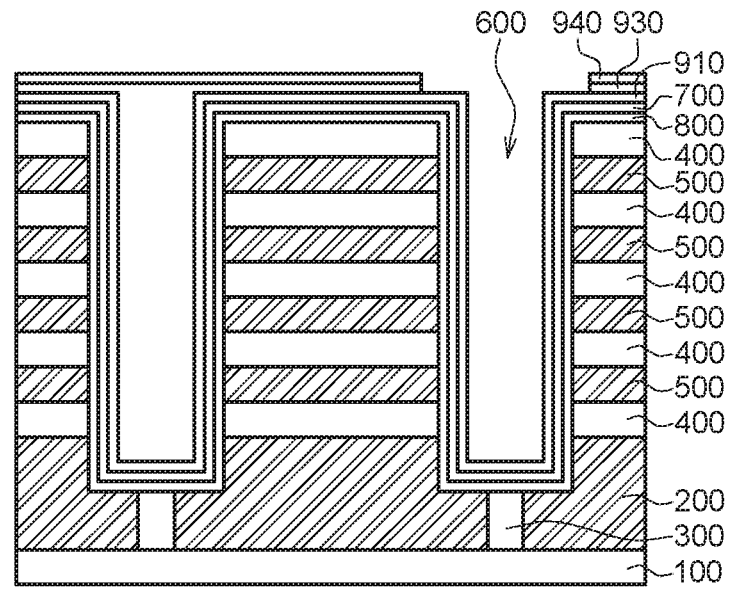

As shown in FIG. 8D, a portion of the organic dielectric layer 930 and the hard mask layer 940 are etched and removed according to the patterned mask layer 960 for exposing the hard mask layer 910 and the channel layer 700 located below the hard mask layer 910 in the second insulation recess 600, and the patterned mask layer 960 is etched and removed at the same step. While the material of the organic dielectric layer 930 has a high etching selectivity to the hard mask layer 910, the channel layer 700, the insulating layers 400, and the second conductive layers 500, after the organic dielectric layer 930 is etched and removed, the remained hard mask layer 910 and the channel layer 700 located below maintain intact structures and are free from damages by the etching process.

Figure 8E:
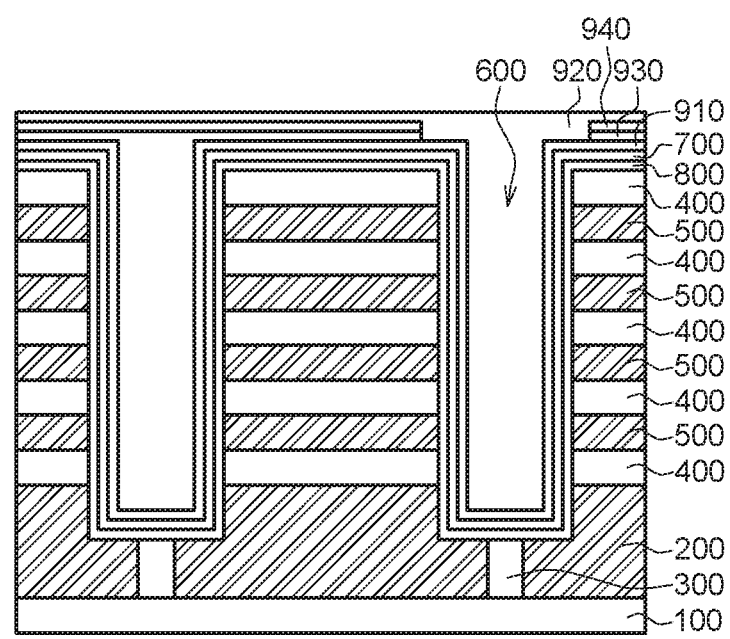

As shown in FIG. 8E, the low-temperature oxide layer 920 is formed on the organic dielectric layer 930 and the hard mask layer 940 and filled in the second insulation recess 600. In the embodiment, the low-temperature oxide layer 920 is formed by such as an atomic layer deposition (ALD) process. The low-temperature oxide layer 920 can protect the hard mask layer 910 and the channel layer 700 from the damage by the following iso-tropical etching process.

Figure 8F:
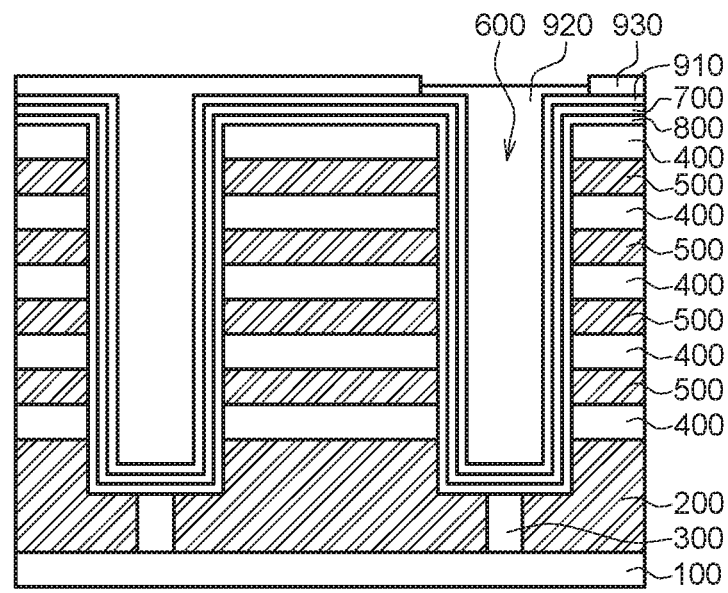

As shown in FIG. 8F, a portion of the low-temperature oxide layer 920 and the hard mask layer 940 are etched and removed to expose the organic dielectric layer 930.

Figure 8G:
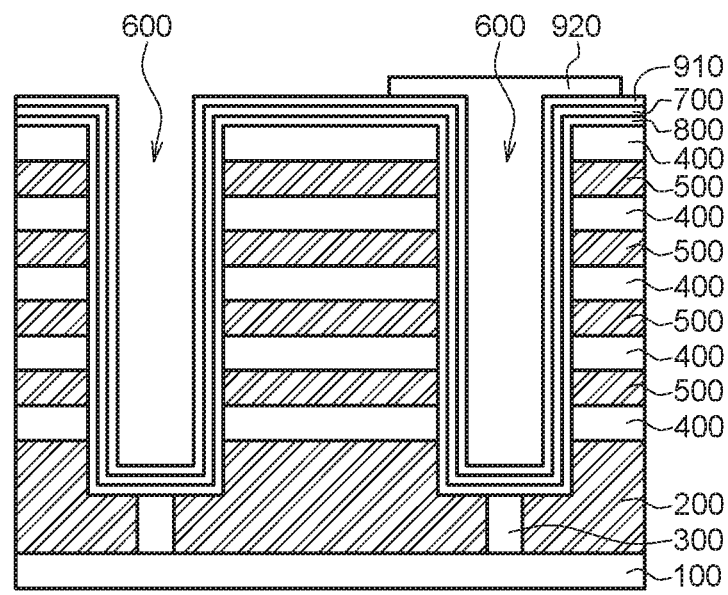

As shown in FIG. 8G, the organic dielectric layer 930 is etched and removed; leaving the low-temperature oxide layer 920, the hard mask layer 910, and the channel layer 700 remained. For example, as shown in FIG. 8G, in the embodiment, the organic dielectric layer 930 located in another second insulation recess 600 is etched and removed in the present step.

Figure 8H:
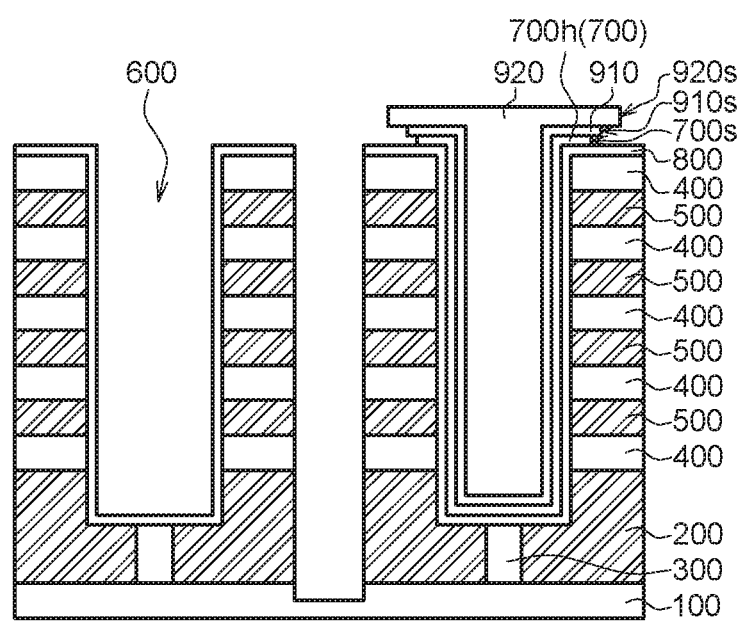

Next, as shown in FIG. 8H, a portion of the hard mask layer 910 and a portion of the channel layer 700 are etched and removed by an iso-tropical etching process, forming the low-temperature oxide layer 920 with the upper portion having an protruding edge, which has a side surface 920s located beyond the side surface 910s of the extending portion 910a of the hard mask layer 910, and the side surface 910s of the extending portion 910a is located beyond the side surface 700s of the horizontal extending portion 700h of the channel layer 700.

In the embodiment, the iso-tropical etching process includes such as applying hot $H_3PO_4$ etching solution or applying chemical dry etch (CDE) process to etch the hard mask layer 910, and applying $NH_4OH$ etching solution or TMAH etching solution or applying chemical dry etch (CDE) process to etch the channel layer 700.

Next, please refer to FIG. 3, the top oxide layer 900 is formed on the insulating layers 400, the second conductive layers 500, and the low-temperature oxide layer 920. As such, the memory structure 30 as shown in FIG. 3 is formed.

According to the manufacturing method of the embodiments of the present disclosure, the horizontal extending portion 700h can be formed to electrically connect to the bit lines of the memory device without etching the memory layer 800. As such, the memory layer 800 can remain intact, such that the distribution of the electric field of the memory layer 800 can maintain uniform, reducing the edge effect caused by un-uniform distribution of electric field and effectively maintaining and improving the efficiency and speed of program/erase operations of the memory device.

Please refer to FIGS. 7A-7F and FIGS. 9A-9B, which illustrate a process for manufacturing a memory structure according to a further embodiment of the present disclosure. The elements in the present embodiment sharing similar or the same labels with those in the previous embodiments are similar or the same elements, and the description of which is omitted.

After the steps as shown in FIGS. 7A-7F are performed, next, as shown in FIG. 8A, the hard mask layer 910 is formed on the channel layer 700. In the embodiment, the hard mask layer 910 is such as a silicon nitride layer or a silicon oxide layer. The hard mask layer 901 in the present step may be used for protecting the channel layer 700.

Figure 9A:
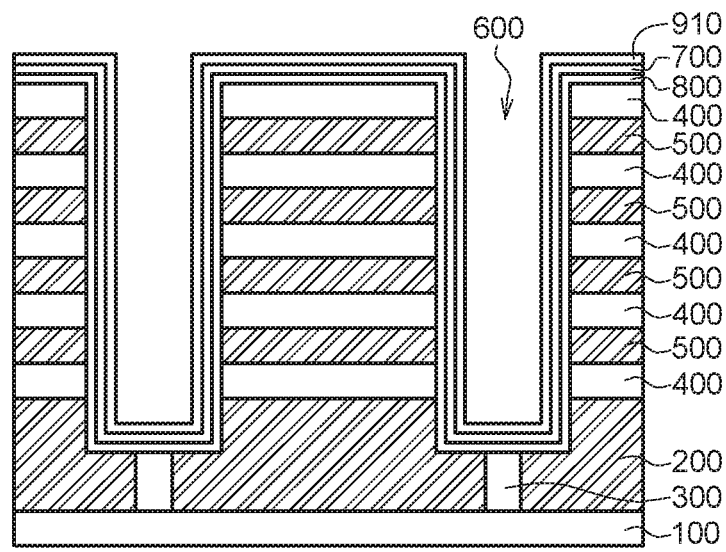
FIGS. 9A-9B illustrate a process for manufacturing a memory structure according to a further embodiment of the present disclosure.
Figure 9B:
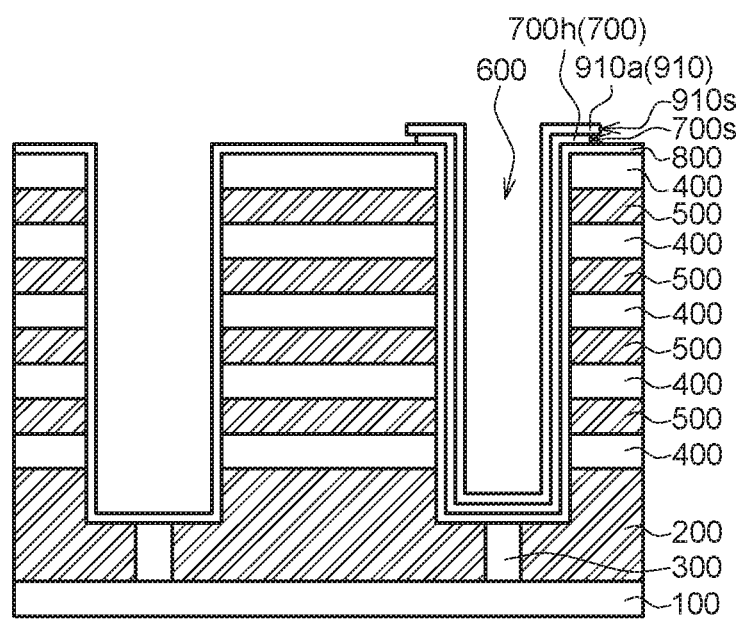

Next, as shown in FIG. 9B, a portion of the hard mask layer 910 and a portion of the channel layer 700 are etched and removed by an iso-tropical etching process, forming the side surface 910s of the extending portion 910a of the hard mask layer 910 located beyond the side surface 700s of the horizontal extending portion 700h of the channel layer 700. In the embodiment, for example, the structure including the low-temperature oxide layer 920 as shown in FIG. 8H is formed, and then the low-temperature oxide layer 920 is removed by diluted hydrofluoric acid (DHF).

In the embodiment, the iso-tropical etching process includes such as applying hot $H_3PO_4$ etching solution or applying chemical dry etch (CDE) process to etch the hard mask layer 910, and applying $NH_4OH$ etching solution or TMAH etching solution or applying chemical dry etch (CDE) process to etch the channel layer 700.

Next, please refer to FIG. 2, the top oxide layer 900 is formed on the insulating layers 400 and the second conductive layers 500. As such, the memory structure 30 as shown in FIG. 3 is formed.

FIGS. 10A-10K illustrate a process for manufacturing a memory structure according to an additional embodiment of the present disclosure. The elements in the present embodiment sharing similar or the same labels with those in the previous embodiments are similar or the same elements, and the description of which is omitted.

Figure 10A:
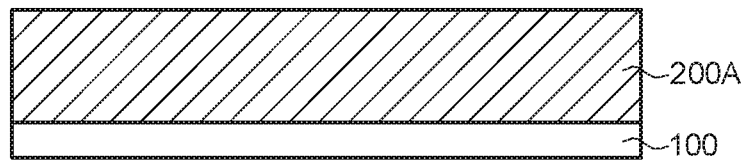
FIGS. 10A-10K illustrate a process for manufacturing a memory structure according to an additional embodiment of the present disclosure.

As shown in FIG. 10A, the bottom oxide layer 100 is formed, and an insulating layer 200A is formed on the bottom oxide layer 100. In the embodiment, the insulating layer 200A is such as a silicon nitride layer having a thickness T1 of such as 1500-4000 Å.

Figure 10B:
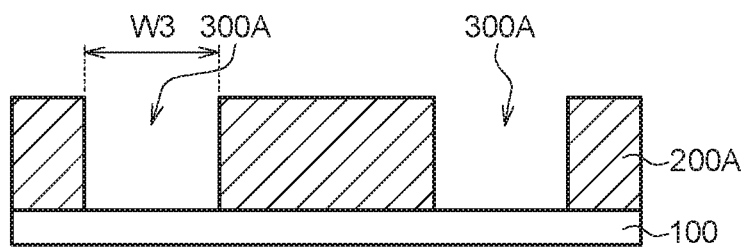

As shown in FIG. 10B, a recess 300A is formed. The recess 300A penetrates through the insulating layer 200A and is located on the bottom oxide layer 100. The recess 300A has a width W3 of such as 70-150 nm. In the embodiment, for example, an etching process is performed on the insulating layer 200A and stops on the bottom oxide layer 100 for forming the recess 300A.

Figure 10C:
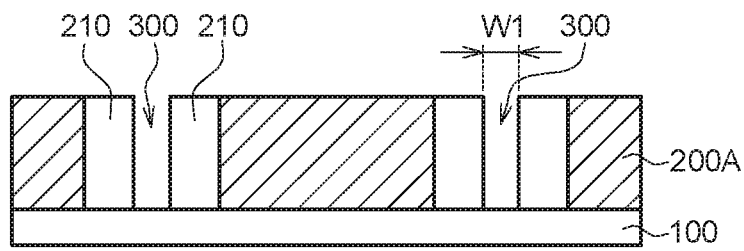

As shown in FIG. 10C, the conductive portion 210 is formed on the side walls of the recess 300A for defining the first insulation recess 300. In the embodiment, for example, a conductive material is filled in the recess 300A, and then the conductive material in the recess 300A is etched for forming the first insulation recess 300 and the conductive portion 210. The first insulation recess 300 has the first width W1 of 10-30 nm. In the embodiment, the conductive material is such as polysilicon.

Figure 10D:
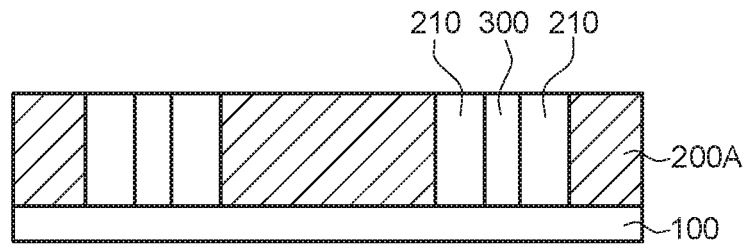

As shown in FIG. 10D, an insulating material is filled in the first insulating recess 300.

Figure 10E:
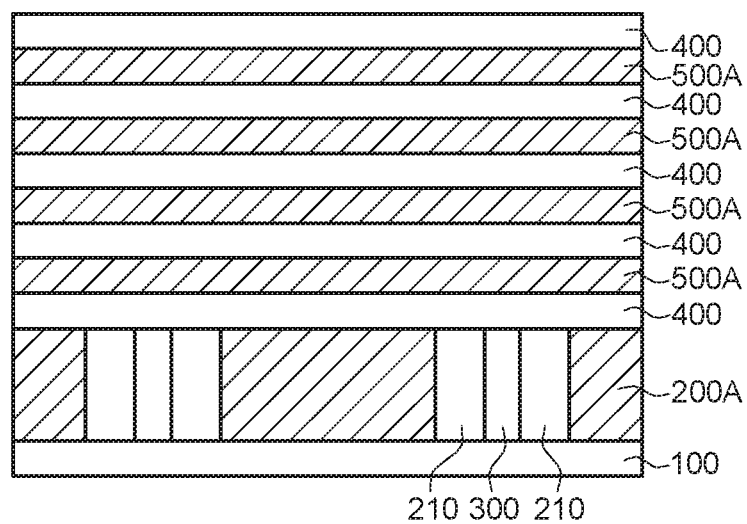

As shown in FIG. 10E, a plurality of insulating layers 400 are formed on the first insulation recess 300, the conductive portion 210, and the insulating layer 200A, and a plurality of sacrificial layers 500A are formed. The sacrificial layers 500A and the insulating layers 400 are interlacedly stacked.

In the embodiment, the insulating layers 400 are such as silicon oxide layers, and the sacrificial layers 500A are such as silicon nitride layers.

Figure 10F:
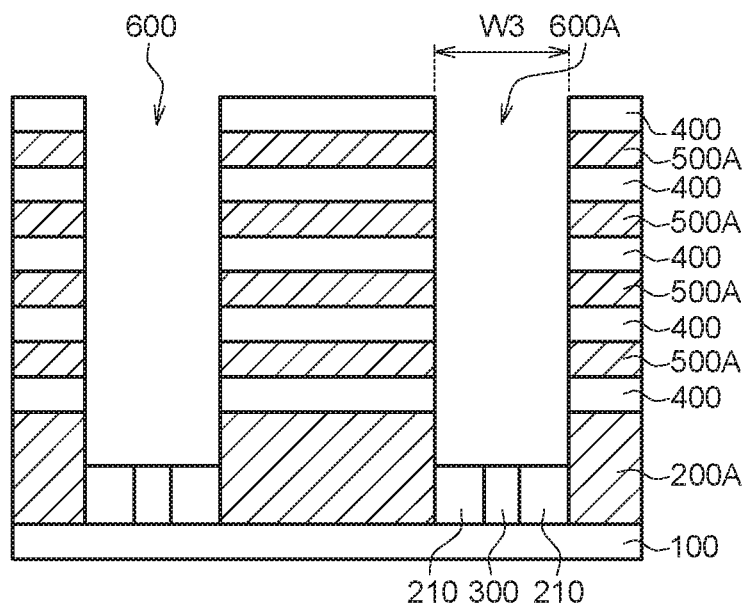

As shown in FIG. 10F, the second insulation recess 600 is formed to penetrate through the insulating layers 400 and the sacrificial layers 500A and is located on the first insulation recess 300. The second width W2 of the second insulation recess 600 is larger than the first width W1 of the first insulation recess 300. In the embodiment, the second width W2 of the second insulation recess 600 is such as 50-150 nm.

Figure 10G:
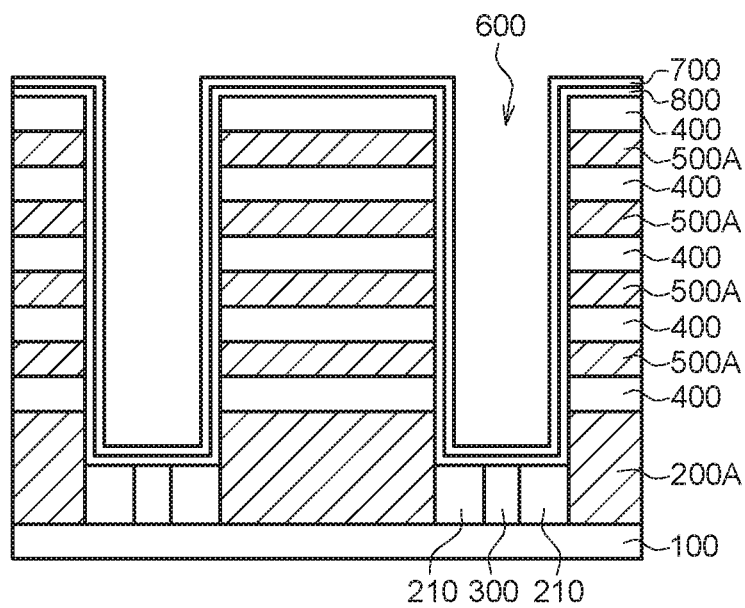

As shown in FIG. 10G, the channel layer 700 is formed on at least a sidewall of the second insulation recess 600, and the memory layer 800 is formed between the channel layer 700 and the sacrificial layers 500A.

Figure 10H:
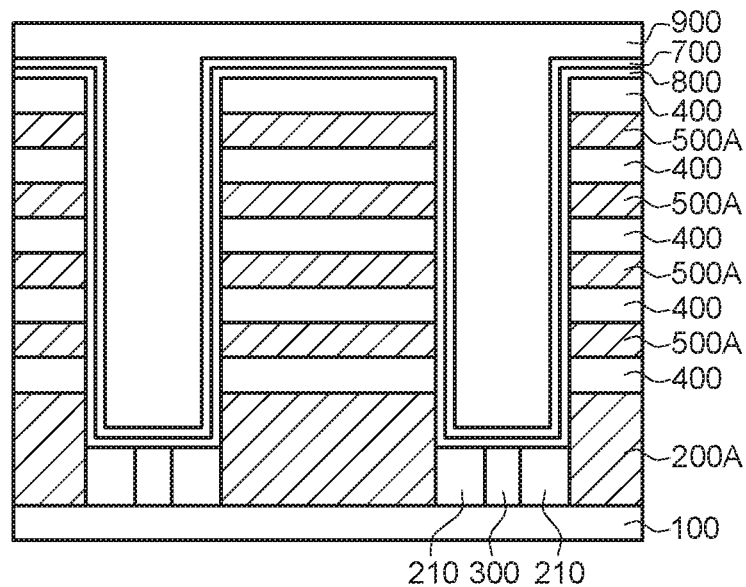

As shown in FIG. 10H, the top oxide layer 900 is formed on the insulating layers 400 and the sacrificial layers 500A.

Figure 10I:
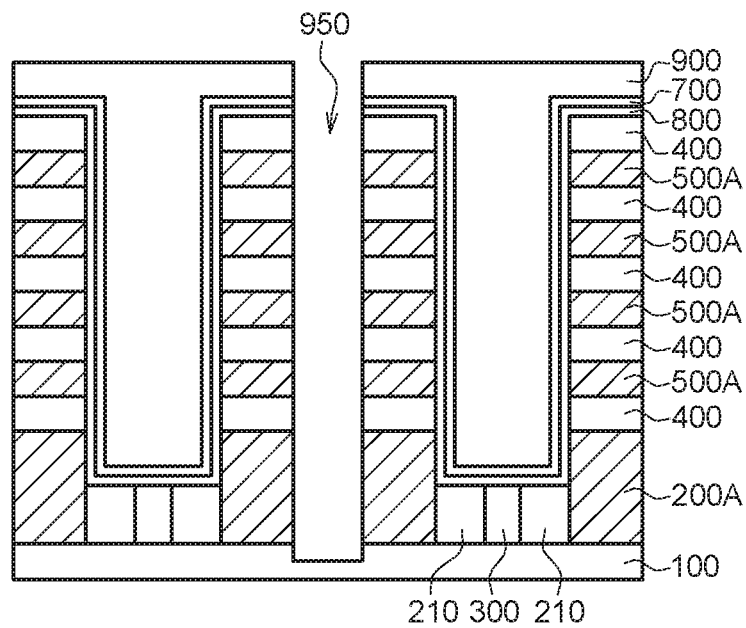

As shown in FIG. 10I, a through opening 950 is formed. The through opening 950 penetrates through the top oxide layer 900, the channel layer 700, the memory layer 800, the insulating layers 400, the sacrificial layers 500A, and the insulating layer 200A and located on the bottom oxide layer 100.

Figure 10J:
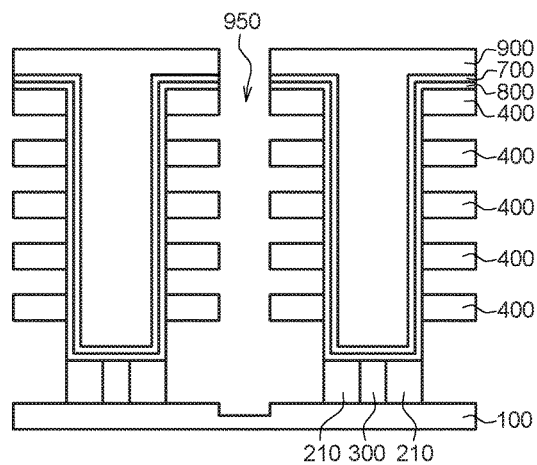

As shown in FIG. 10J, the sacrificial layers 500A and the insulating layer 200A are removed. In the embodiment, for example, an etching solution is introduced through the through opening 950 to etch and remove the sacrificial layers 500A and the insulating layer 200A.

Figure 10K:
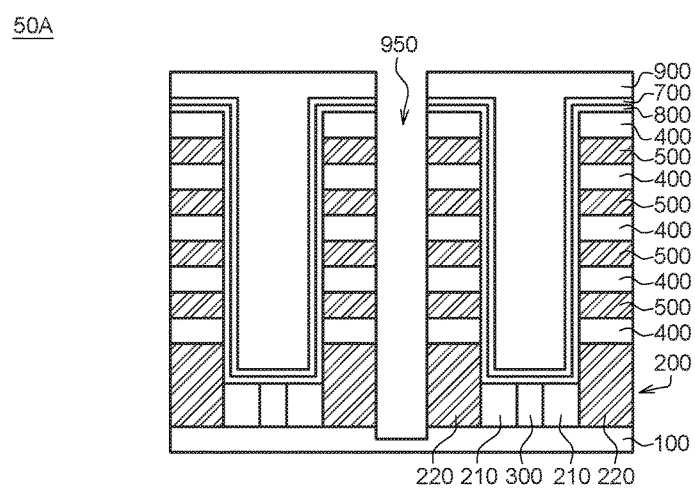

As shown in FIG. 10K, the conductive portion 220 and the second conductive layers 500 are formed. In the embodiment, for example, a conductive material is introduced through the through opening 950 to fill the voids left from etching away the sacrificial layers 500A and the insulating layer 200A, and then an etching solution is introduced through the through opening 950 to etch and separated the conductive material by the through opening 950. As such, the memory structure 50A as shown in FIG. 10K is formed.

In another embodiment, please refer to FIG. 5, FIGS. 8A-8H, and FIGS. 10A-10K. After the step as shown in FIG. 10G is performed, the steps as shown in FIGS. 8A-8H are performed to form the structure with the low-temperature oxide layer 920, the extending portion 910a of the hard mask layer 910, and the horizontal extending portion 700h of the channel layer 700 as shown in FIG. 5, and then the steps as shown in FIGS. 10H-10K are performed. Finally, an oxide material is coated on the top oxide layer 900 and in the through opening 950; as such, the memory structure 50 as shown in FIG. 5 is formed.

The manufacturing method of the memory structure 40 as shown in FIG. 4 is different from the manufacturing method of the memory structure 50 as shown in FIG. 5 in the steps as shown in FIGS. 10B-10C, wherein the recess 300A and the conductive portion 210 are not formed, and the first insulation recess 300 having the first width W1 of 10-30 nm is formed directly in the insulating layer 200A, followed by the steps similar to those as shown in FIGS. 10D-10K.

The manufacturing method of the memory structure 60 as shown in FIG. 6 is different from the manufacturing method of the memory structure 50 as shown in FIG. 5 in the steps as shown in FIGS. 10B-10C, wherein the width W3 of the recess 300A is adjusted to be larger than the predetermined second width W2 of the second insulation recess 600, followed by the steps similar to those as shown in FIGS. 10D-10K.

FIGS. 11A-11K-1 illustrate a process for manufacturing a memory structure according to a still further embodiment of the present disclosure. The elements in the present embodiment sharing similar or the same labels with those in the previous embodiments are similar or the same elements, and the description of which is omitted.

Figure 11A:
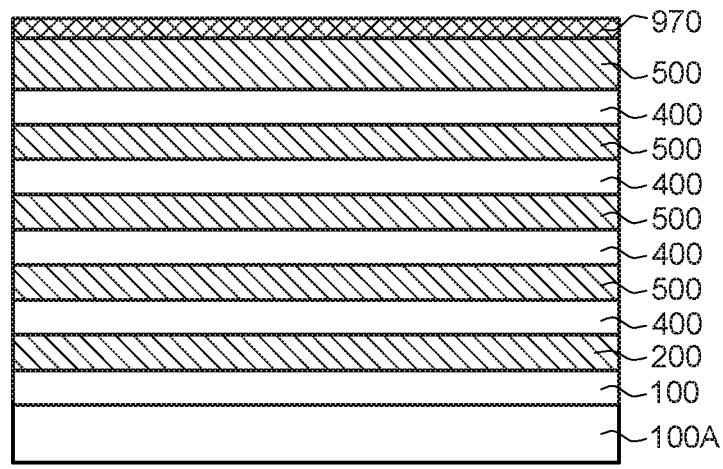

As shown in FIG. 11A, the bottom oxide layer 100 is formed on the substrate 100A, and the first conductive layer 200 is formed on the bottom oxide layer 100. Next, a plurality of insulating layers 400 are formed on the first conductive layer 200, and a plurality of second conductive layers 500 are formed. The second conductive layers 500 and the insulating layers 400 are interlacedly stacked, and the second conductive layers 500 are electrically isolated from the first conductive layer 200. Next, a hard mask layer 970 is formed on the second conductive layers 500.

Figure 11B:
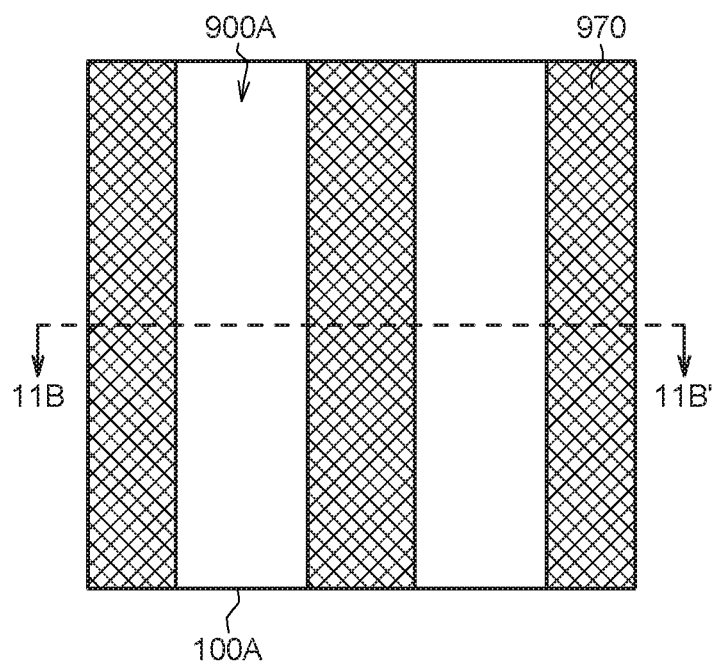
Figures 1, 11B:
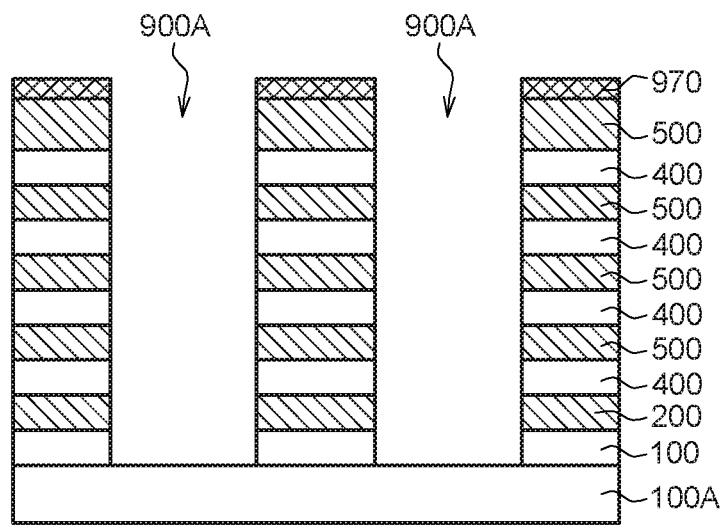

Please refer to FIGS. 11B-11B-1, wherein FIG. 11B-1 is a cross-sectional view along the cross-sectional line 11B-11B' in FIG. 11B. A recess 900A is formed, and the recess 900A penetrates through the insulating layers 400, the second conductive layers 500, the first conductive layer 200, and the bottom oxide layer and is located on the substrate 100A.

Figure 11C:
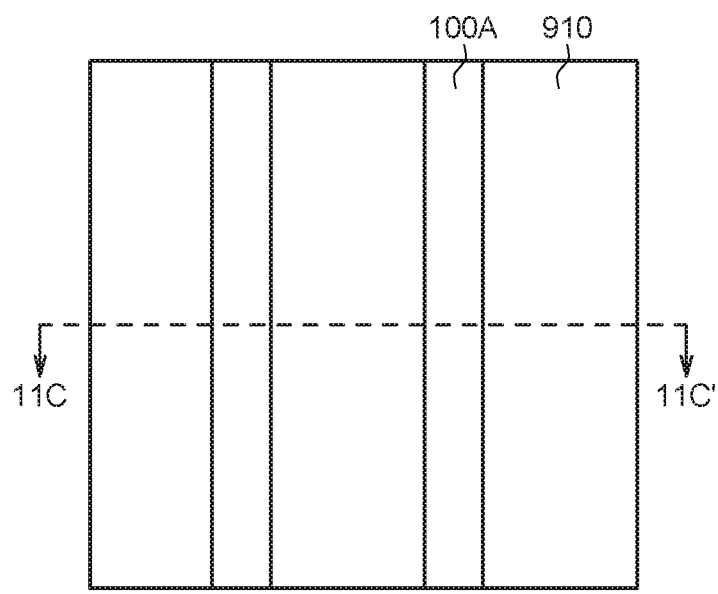
Figures 1, 11C:
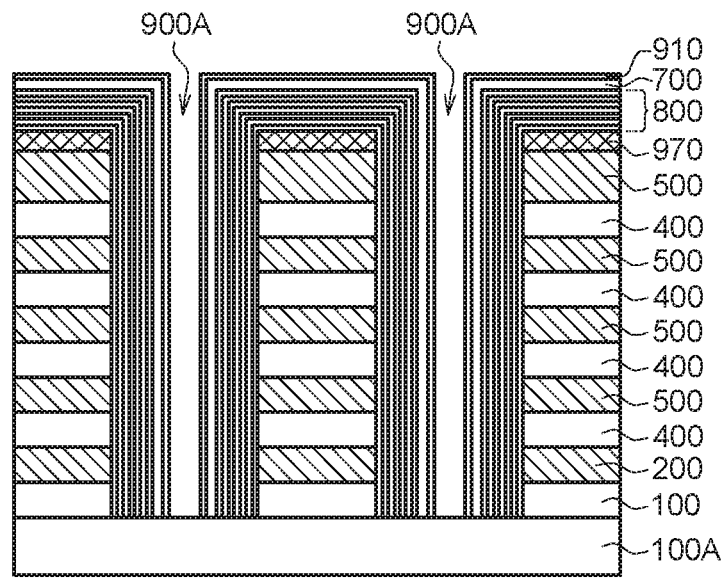

Please refer to FIGS. 11C-11C-1, wherein FIG. 11C-1 is a cross-sectional view along the cross-sectional line 11C-11C' in FIG. 11C. The channel layer 700 is formed on at least a sidewall of the recess 900A, and the memory layer 800 is formed between the channel layer 700 and the second conductive layers 500. In the embodiments, the channel layer 700 is such as a polysilicon layer, and the memory layer 800 may have multi-layers of a silicon oxide-silicon nitride-silicon oxide (ONO) structure, a silicon oxide-silicon nitride-silicon oxide-silicon nitride-silicon oxide (ONONO) structure, or a silicon oxide-silicon nitride-silicon oxide-silicon nitride-silicon oxide-silicon nitride-silicon oxide (ONONONO) structure, but not limited thereto. Next, the hard mask layer 910 is formed on the channel layer 700.

Figure 11D:
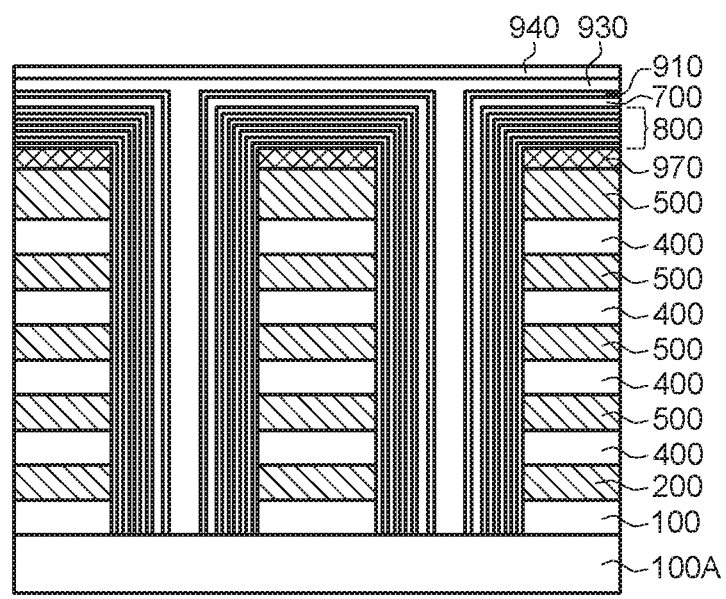

As shown in FIG. 11D, the organic dielectric layer 930 is formed on the hard mask layer 910 and filled the recess 900A, and another hard mask layer 940 is formed on the organic dielectric layer 930.

Figure 11E:
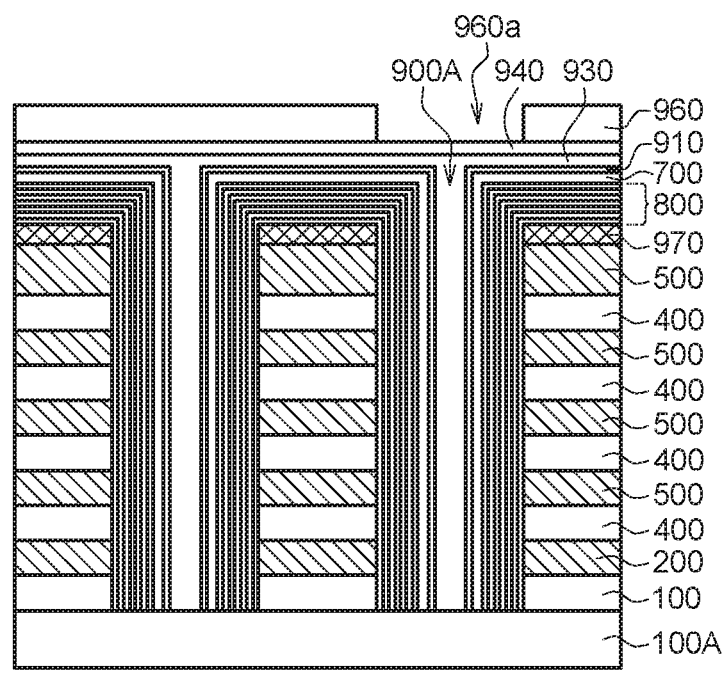

As shown in FIG. 11E, a patterned mask layer 960 is disposed on the hard mask layer 940 for performing the following patterning process. The patterned mask layer 960 has at least an opening 960a, and the opening 960a is corresponding to the predetermined recess 900A.

Figure 11F:
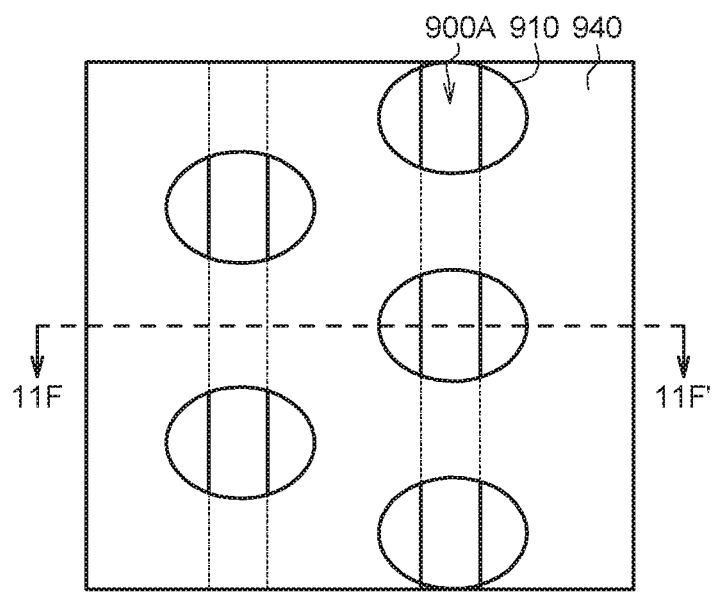
Figures 1, 11F:
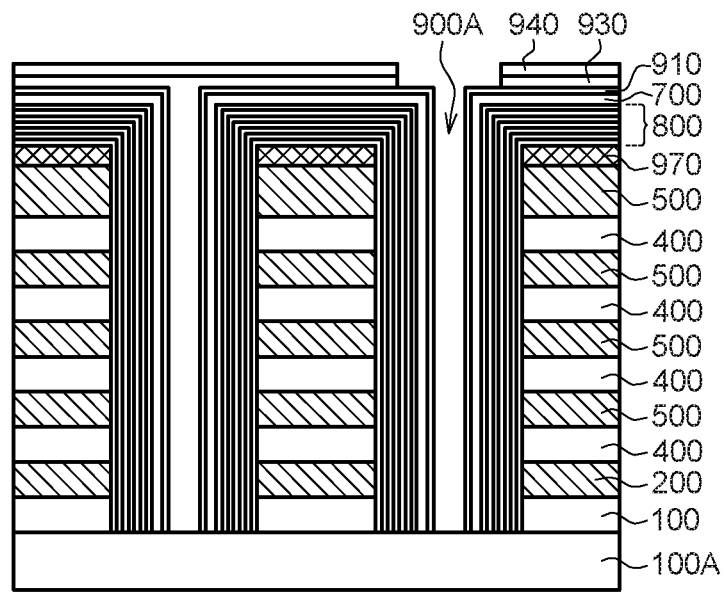

Please refer to FIGS. 11F-11F-1, wherein FIG. 11F-1 is a cross-sectional view along the cross-sectional line 11F-11F' in FIG. 11F. A portion of the organic dielectric layer 930 and the hard mask layer 940 are etched and removed according to the patterned mask layer 960 for exposing the hard mask layer 910 and the channel layer 700 located below the hard mask layer 910 in the predetermined recess 900A, and the patterned mask layer 960 is etched and removed at the same step. While the material of the organic dielectric layer 930 has a high etching selectivity to the hard mask layer 910 and the channel layer 700 located below the hard mask layer 910, after the organic dielectric layer 930 is etched and removed, the remained hard mask layer 910 and the channel layer 700 located below maintain intact structures and are free from damages by the etching process.

Figure 11G:
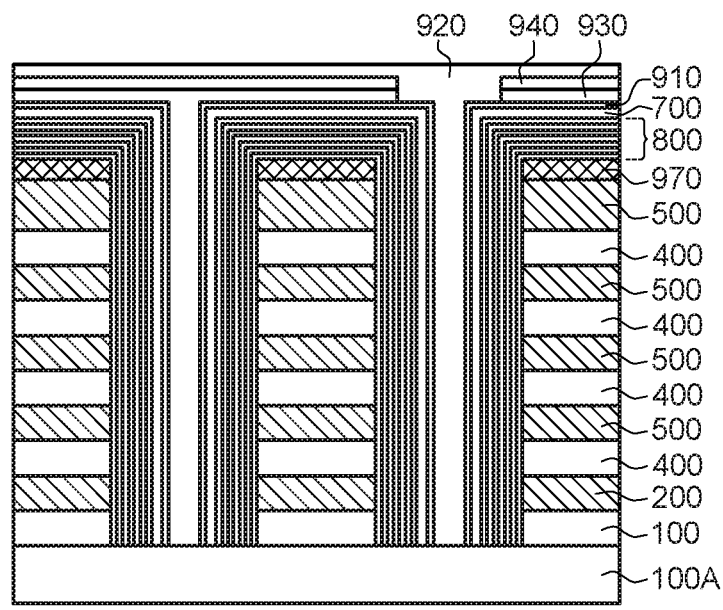

As shown in FIG. 11G, the low-temperature oxide layer 920 is formed on the organic dielectric layer 930 and the hard mask layer 940 and filled in the recess 900A.

Figure 11H:
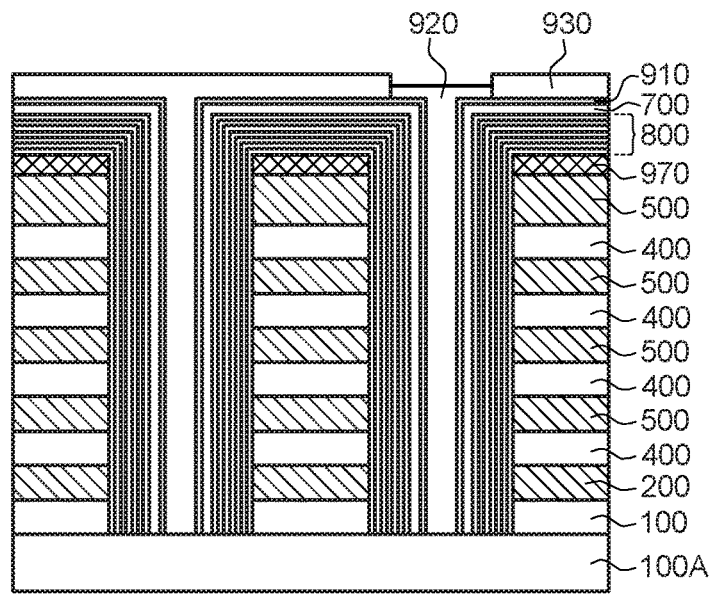

As shown in FIG. 11H, a portion of the low-temperature oxide layer 920 and the hard mask layer 940 are etched and removed to expose the organic dielectric layer 930.

Figure 11I:
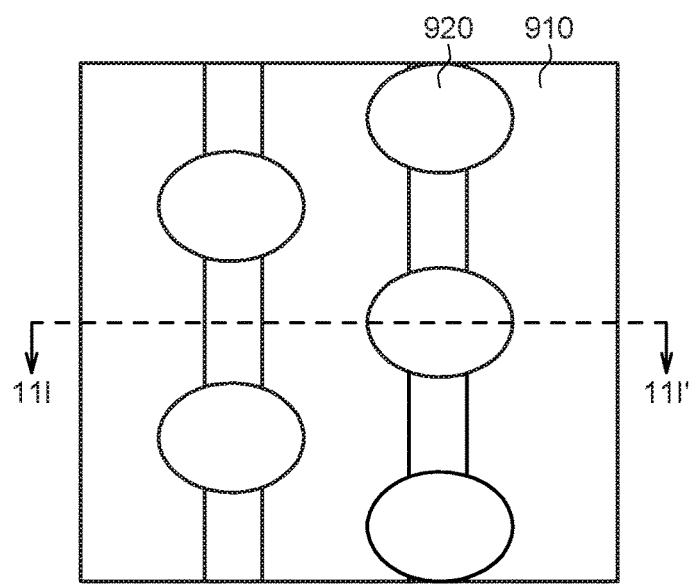
Figures 1, 11I:
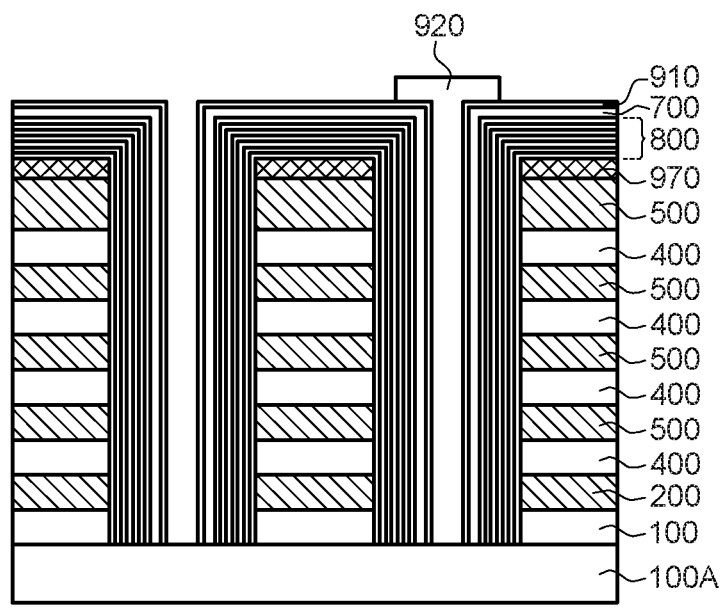

Please refer to FIGS. 11I-11I-1, wherein FIG. 11I-1 is a cross-sectional view along the cross-sectional line 11I-11I' in FIG. 11I. The organic dielectric layer 930 is etched and removed; leaving the low-temperature oxide layer 920, the hard mask layer 910, and the channel layer 700 remained. For example, as shown in FIG. 11I, in the embodiment, the organic dielectric layer 930 located in another recess 900A is etched and removed in the present step.

Figure 11J:
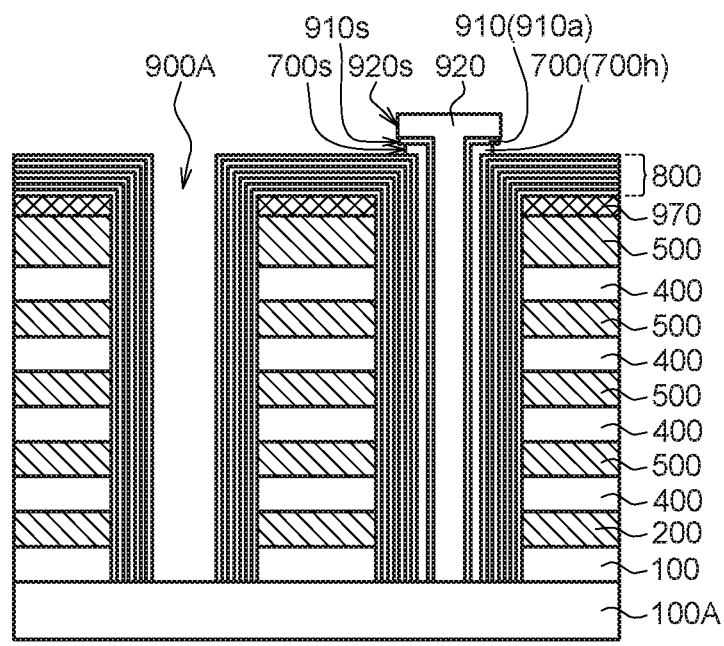

As shown in FIG. 11J, a portion of the hard mask layer 910 and a portion of the channel layer 700 are etched and removed by an iso-tropical etching process, forming the low-temperature oxide layer 920 with the upper portion having an protruding edge, which has a side surface 920s located beyond the side surface 910s of the extending portion 910a of the hard mask layer 910, and the side surface 910s of the extending portion 910a is located beyond the side surface 700s of the horizontal extending portion 700h of the channel layer 700.

Figure 11K:
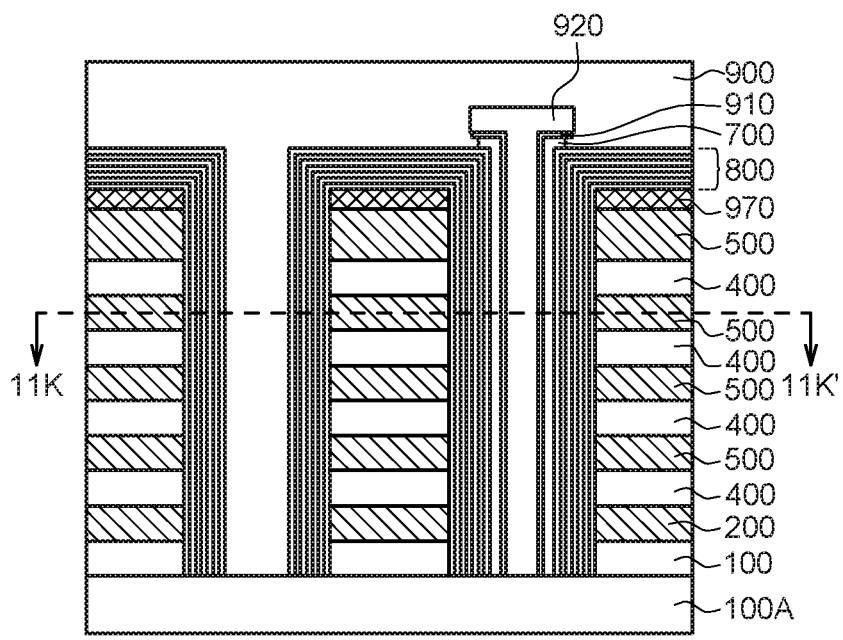
Figures 1, 11K:
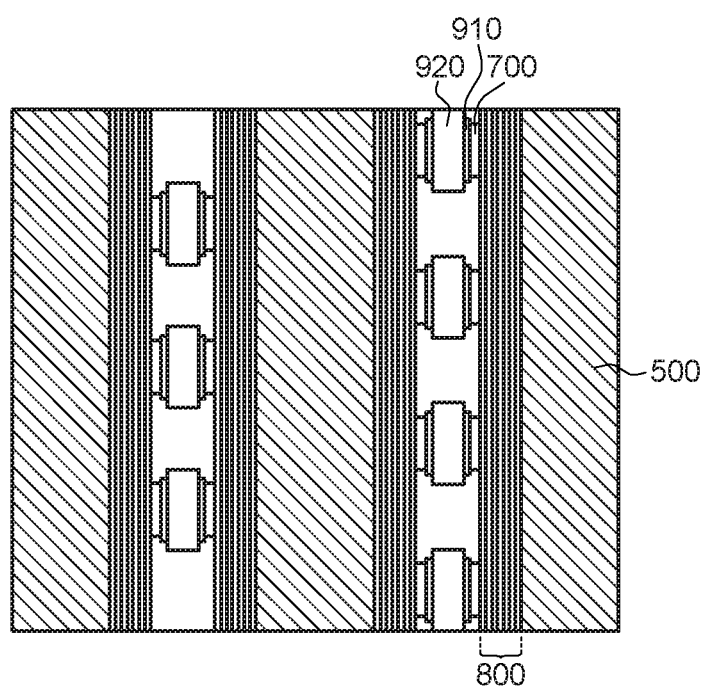

Next, please refer to FIGS. 11K-11K-1, wherein FIG. 11K-1 is a cross-sectional view along the cross-sectional line 11K-11K' in FIG. 11K. The top oxide layer 900 is formed on the insulating layers 400, the second conductive layers 500, the memory layer 800, and the low-temperature oxide layer 920. As such, the memory structure 1100 as shown in FIGS. 11K-11K-1 is formed.

Figure 12A:
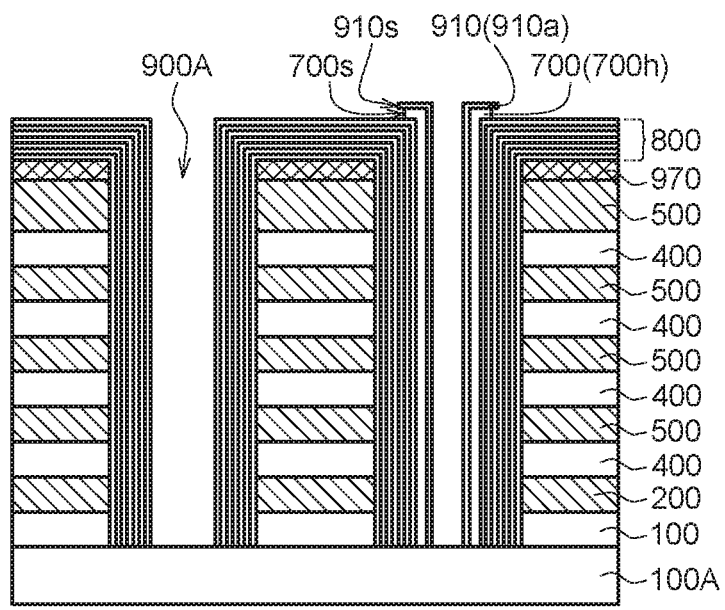
Figure 12B:
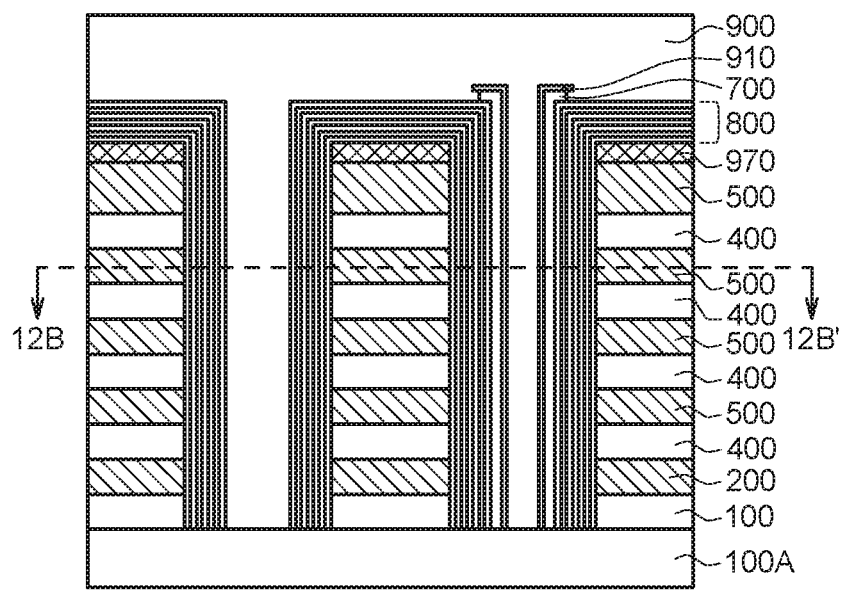
Figures 1, 12B:
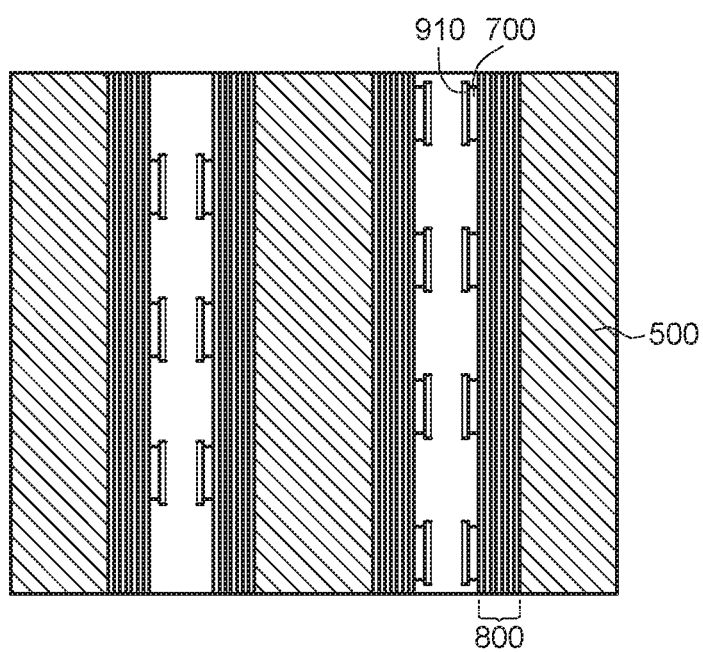

FIGS. 12A-12B-1 illustrate a process for manufacturing a memory structure according to a further additional embodiment of the present disclosure. The elements in the present embodiment sharing similar or the same labels with those in the previous embodiments are similar or the same elements, and the description of which is omitted.

After the steps as shown in FIGS. 11A-11F-1 are performed, the steps as shown in FIGS. 9A-9B are performed to form the structure as shown in FIG. 12A, wherein the side surface 910s of the extending portion 910a of the hard mask layer 910 is located beyond the side surface 700s of the horizontal extending portion 700h of the channel layer 700.

Next, please refer to FIGS. 12B-12B-1, wherein FIG. 12B-1 is a cross-sectional view along the cross-sectional line 12B-12B' in FIG. 12B. The top oxide layer 900 is formed on the insulating layers 400, the second conductive layers 500, and the memory layer 800. As such, the memory structure 1200 as shown in FIGS. 12B-12B-1 is formed.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A memory structure, comprising:
   a bottom oxide layer;
   a first conductive layer located on the bottom oxide layer;
   a first insulation recess penetrating through the first conductive layer and located on the bottom oxide layer, wherein the bottom oxide layer contacts with the first insulation recess, and the first insulation recess has a first width;
   a plurality of insulating layers located on the first conductive layer;
   a plurality of second conductive layers, wherein the second conductive layers and the insulating layers are interlacedly stacked, and the second conductive layers are electrically isolated from the first conductive layer;
   a second insulation recess penetrating through the insulating layers and the second conductive layers and located on the first insulation recess, the second insulation recess having a second width larger than the first width;
a channel layer located on at least a sidewall of the second insulation recess; and
a memory layer located between the channel layer and the second conductive layers;
wherein the channel layer has a vertical extending portion and a horizontal extending portion, the horizontal extending portion is located above the second conductive layers, and the memory structure further comprises:
a hard mask layer located on the channel layer, wherein the hard mask layer has an extending portion located on the horizontal extending portion of the channel layer, and the extending portion of the hard mask layer has an extending length longer than an extending length of the horizontal extending portion of the channel layer.

2. The memory structure according to claim 1, wherein the channel layer is further located on a bottom surface of the second insulation recess.

3. The memory structure according to claim 1, wherein the first conductive layer has a thickness of 1500-4000 Å.

4. The memory structure according to claim 1, wherein the first width of the first insulation recess is 15-30 nm.

5. The memory structure according to claim 1, wherein the second width of the second insulation recess is 70-120 nm.

6. The memory structure according to claim 1, further comprising:
a low-temperature oxide layer located on the hard mask layer and fully covering the extending portion of the hard mask layer.

7. The memory structure according to claim 1, further comprising:
a through opening penetrating through the insulating layers, the second conductive layers, and the first conductive layer and located on the bottom oxide layer.

8. The memory structure according to claim 1, further comprising:
a top oxide layer located on the insulating layers and the second conductive layers.

9. The memory structure according to claim 1, wherein the first conductive layer and the second conductive layers respectively comprise polysilicon or tungsten.

10. A manufacturing method of a memory structure, comprising:
forming a bottom oxide layer;
forming a first conductive layer on the bottom oxide layer;
forming a first insulation recess penetrating through the first conductive layer and located on the bottom oxide layer, wherein the bottom oxide layer contacts with the first insulation recess, and the first insulation recess has a first width;
forming a plurality of insulating layers on the first conductive layer;
forming a plurality of second conductive layers, wherein the second conductive layers and the insulating layers are interlacedly stacked, and the second conductive layers are electrically isolated from the first conductive layer;
forming a second insulation recess penetrating through the insulating layers and the second conductive layers and located on the first insulation recess, the second insulation recess having a second width larger than the first width;
forming a channel layer on at least a sidewall of the second insulation recess; and
forming a memory layer between the channel layer and the second conductive layers,
wherein the channel layer has a vertical extending portion and a horizontal extending portion, the horizontal extending portion is located above the second conductive layers, and the manufacturing method of the memory structure further comprises:
forming a hard mask layer on the channel layer, wherein the hard mask layer has an extending portion located on the horizontal extending portion of the channel layer, and the extending portion of the hard mask layer has an extending length longer than an extending length of the horizontal extending portion of the channel layer.

11. The manufacturing method of the memory structure according to claim 10, wherein the channel layer is further formed on a bottom surface of the second insulation recess.

12. The manufacturing method of the memory structure according to claim 10, wherein the first conductive layer has a thickness of 1500-4000 Å.

13. The manufacturing method of the memory structure according to claim 10, wherein the first width of the first insulation recess is 15-30 nm.

14. The manufacturing method of the memory structure according to claim 10, wherein the second width of the second insulation recess is 70-120 nm.

15. The manufacturing method of the memory structure according to claim 10, further comprising:
forming a low-temperature oxide layer on the hard mask layer fully covering the extending portion of the hard mask layer.

16. The manufacturing method of the memory structure according to claim 10, further comprising:
forming a through opening penetrating through the insulating layers, the second conductive layers, and the first conductive layer and located on the bottom oxide layer.

17. The manufacturing method of the memory structure according to claim 10, further comprising:
forming a top oxide layer on the insulating layers and the second conductive layers.

18. The manufacturing method of memory structure according to claim 10, wherein the first conductive layer and the second conductive layers respectively comprise polysilicon or tungsten.

* * * * *